(12) United States Patent
Feng et al.

(10) Patent No.: US 12,217,678 B2
(45) Date of Patent: Feb. 4, 2025

(54) DISPLAY SUBSTRATE AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/257,521

(22) PCT Filed: Apr. 27, 2022

(86) PCT No.: PCT/CN2022/089661
§ 371 (c)(1),
(2) Date: Jun. 14, 2023

(87) PCT Pub. No.: WO2023/206167
PCT Pub. Date: Nov. 2, 2023

(65) Prior Publication Data
US 2024/0371324 A1    Nov. 7, 2024

(51) Int. Cl.
*G09G 3/3233*    (2016.01)
*H10K 59/121*    (2023.01)
*H10K 59/131*    (2023.01)

(52) U.S. Cl.
CPC ....... *G09G 3/3233* (2013.01); *H10K 59/1213* (2023.02); *H10K 59/131* (2023.02); *G09G 2300/0842* (2013.01)

(58) Field of Classification Search
CPC ...... G09G 3/32; G09G 3/3233; H10K 59/131; H10K 59/1213
See application file for complete search history.

(56) References Cited

U.S. PATENT DOCUMENTS

2020/0358930 A1* 11/2020 Nicholson ................ G09G 3/20
2021/0201770 A1    7/2021 Park et al.
(Continued)

FOREIGN PATENT DOCUMENTS

| CN | 102879962 A | 1/2013 |
| CN | 110956929 A | 4/2020 |
| CN | 210489212 U | 5/2020 |

(Continued)

*Primary Examiner* — Kevin M Nguyen
(74) *Attorney, Agent, or Firm* — IP & T GROUP LLP

(57) ABSTRACT

A display substrate includes a plurality of pixel circuits, and the pixel circuits each include a sensing circuit and a light-emitting control circuit. In a second direction, adjacent three rows of pixel circuits are a first row of pixel circuits, a second row of pixel circuits and a third row of pixel circuits. A region between the first row of pixel circuits and the second row of pixel circuits is a first gap region. In the first row of pixel circuits and the second row of pixel circuits, a sensing circuit of each pixel circuit is closer to the first gap region than a light-emitting control circuit of the pixel circuit, and sensing signal terminals of sensing circuits of two pixel circuits in a same column are a same signal terminal.

20 Claims, 26 Drawing Sheets

(56) References Cited

U.S. PATENT DOCUMENTS

2021/0334500 A1* 10/2021 Huang ................ H10K 59/122
2023/0298377 A1    9/2023 Hu

FOREIGN PATENT DOCUMENTS

| CN | 111653591 | A | 9/2020 |
| CN | 113724647 | A | 11/2021 |
| CN | 215834552 | U | 2/2022 |
| JP | 2015129944 | A | 7/2015 |
| JP | 2017151447 | A | 8/2017 |

* cited by examiner

CNT

Y
↑
└→ X

PVX

PLN

AND

DISPLAY SUBSTRATE AND DISPLAY APPARATUS

CROSS-REFERENCE TO RELATED APPLICATION

This application is a national phase entry under 35 USC 371 of International Patent Application No. PCT/CN2022/089661, filed on Apr. 27, 2022, which is incorporated herein by reference in its entirety.

TECHNICAL FIELD

The present disclosure relates to the field of display technologies, and in particular, to a display substrate and a display apparatus.

BACKGROUND

Organic light-emitting diodes (OLEDs) display technology is a technology that uses light-emitting materials to emit light under drive of the current to realize display. OLED displays have ultra-light, ultra-thin, high brightness, wide viewing angle, low voltage, low power consumption, fast response, high definition, shock resistance, bendable, low cost, simple process, use less raw materials, high luminous efficiency, wide temperature range and other advantages.

SUMMARY

In an aspect, a display substrate is provided. The display substrate includes a plurality of pixel circuits. The pixel circuits each include a sensing circuit and a light-emitting control circuit, the sensing circuit has a sensing signal terminal, and the light-emitting control circuit has a first voltage signal terminal. The plurality of pixel circuits are arranged in a plurality of rows in a first direction and in a plurality of columns in a second direction. In the second direction, adjacent three rows of pixel circuits are a first row of pixel circuits, a second row of pixel circuits and a third row of pixel circuits. A region between the first row of pixel circuits and the second row of pixel circuits is a first gap region, and a region between the second row of pixel circuits and the third row of pixel circuits is a second gap region. In the first row of pixel circuits and the second row of pixel circuits, a sensing circuit of each pixel circuit is closer to the first gap region than a light-emitting control circuit of the pixel circuit, and sensing signal terminals of sensing circuits of two pixel circuits in a same column are a same signal terminal. And/or in the second row of pixel circuits and the third row of pixel circuits, a light-emitting control circuit of each pixel circuit is closer to the second gap region than a sensing circuit of the pixel circuit, and first voltage signal terminals of light-emitting control circuits of two pixel circuits in a same column are a same signal terminal.

In some embodiments, the sensing circuit includes a first transistor. In the first row of pixel circuits and the second row of pixel circuits, first electrodes of first transistors of the two sensing circuits in the same column are a same electrode, and constitute the sensing signal terminal.

In some embodiments, the display substrate further includes a plurality of sensing signal lines. A sensing signal line includes a first sensing signal sub-line extending in the second direction, and a plurality of second sensing signal sub-lines each extending in the first direction and electrically connected to the first sensing signal sub-line. A second sensing signal sub-line is located in the first gap region and is electrically connected to sensing signal terminals of at least two columns of pixel circuits.

In some embodiments, the at least two columns of pixel circuits are located on opposite sides of the first sensing signal sub-line.

In some embodiments, sensing circuits of the at least two columns of pixel circuits electrically connected to the second sensing signal sub-line are symmetrically disposed with respect to the first sensing signal sub-line.

In some embodiments, the two sensing circuits in the same column in the first row of pixel circuits and the second row of pixel circuits are symmetrically disposed with respect to the second sensing signal sub-line.

In some embodiments, the light-emitting control circuit includes a second transistor. In the second row of pixel circuits and the third row of pixel circuits, first electrodes of second transistors of the two light-emitting control circuits in the same column are a same electrode, and constitute the first voltage signal terminal.

In some embodiments, the display substrate further includes a plurality of first voltage signal lines. A first voltage signal line includes a first voltage signal sub-line extending in the second direction, and a plurality of second voltage signal sub-lines each extending in the first direction and electrically connected to the first voltage signal sub-line. A second voltage signal sub-line is located in the second gap region and is electrically connected to first voltage signal terminals of at least two columns of pixel circuits.

In some embodiments, the at least two columns of pixel circuits are located on opposite sides of the first voltage signal sub-line.

In some embodiments, light-emitting control circuits of the at least two columns of pixel circuits electrically connected to the second voltage signal sub-line are symmetrically disposed with respect to the first voltage signal sub-line.

In some embodiments, the two light-emitting control circuits located in the same column in the second row of pixel circuits and the third row of pixel circuits are symmetrically disposed with respect to the second voltage signal sub-line.

In some embodiments, the display substrate further includes a plurality of first sensing signal sub-lines and a plurality of first voltage signal sub-lines. The plurality of first sensing signal sub-lines and the plurality of first voltage signal sub-lines extend in the second direction. The first sensing signal sub-lines and the first voltage signal sub-lines are disposed alternately, and a first sensing signal sub-line and a first voltage signal sub-line that are adjacent are provided with at least one column of pixel circuits therebetween.

In some embodiments, the display substrate further includes a first scan signal line, a second scan signal line, a sensing signal line, a first voltage signal line, a data signal line, and an enable signal line. Each of the plurality of pixel circuits further includes a switch circuit and a driving circuit. The switch circuit is electrically connected to the first scan signal line, the data signal line and a first node; and the switch circuit is configured to, under control of a first scan signal provided by the first scan signal line, transmit a data signal provided by the data signal line to the first node. The light-emitting control circuit is electrically connected to the enable signal line, the first voltage signal line and a second node; and the light-emitting control circuit is configured to, under control of an enable signal provided by the enable signal line, transmit a first voltage signal transmitted by the first voltage signal line to the second node. The driving circuit is electrically connected to the first node, the second node, and a third node; and the driving circuit is configured to, under control of an electrical signal of the first node, transmit an electrical signal of the second node to the third node. The sensing circuit is electrically connected to the second scan signal line, the sensing signal line, and the third node; and the sensing circuit is configured to, under control of a second scan signal provided by the second scan signal line, transmit a reference voltage signal provided by the sensing signal line to the third node, or detect an electrical signal of the third node through the sensing signal line to realize external compensation.

In some embodiments, the sensing circuit includes a first transistor. A gate of the first transistor is electrically connected to the second scan signal line, a first electrode of the first transistor is electrically connected to the sensing signal line, and a second electrode of the first transistor is electrically connected to the third node. The light-emitting control circuit includes a second transistor. A gate of the second transistor is electrically connected to the enable signal line, a first electrode of the second transistor is electrically connected to the first voltage signal line, and a second electrode of the second transistor is electrically connected to the second node. The switch circuit includes a third transistor. A gate of the third transistor is electrically connected to the first scan signal line, a first electrode of the third transistor is electrically connected to the data signal line, and a second electrode of the third transistor is electrically connected to the first node. The driving circuit includes a fourth transistor and a storage capacitor. A gate of the fourth transistor is electrically connected to the first node, a first electrode of the fourth transistor is electrically connected to the second node, and a second electrode of the fourth transistor is electrically connected to the third node. A first electrode of the storage capacitor is electrically connected to the first node, and a second electrode of the storage capacitor is electrically connected to the third node.

In some embodiments, in the second direction, the first transistor is located on a side of the storage capacitor, and the second transistor, the third transistor, and the fourth transistor are located on another side of the storage capacitor. The fourth transistor is located between the storage capacitor and the second transistor. In the first direction, the third transistor is located on a side of the fourth transistor, and in the second direction, the third transistor is located between the fourth transistor and the second transistor.

In some embodiments, the display substrate includes a source-drain conductive layer. The first electrode of the first transistor includes a first source pattern located in the source-drain conductive layer. In the first row of pixel circuits and the second row of pixel circuits, first source patterns of two first transistors in the same column have a one-piece structure. The first electrode of the second transistor includes a second source pattern located in the source-drain conductive layer; in the second row of pixel circuits and the third row of pixel circuits, second source patterns of two second transistors in the same column have a one-piece structure.

In some embodiments, the display substrate includes a semiconductor layer and a transfer layer that are arranged in sequence. The transfer layer is located on a side of the semiconductor layer away from the source-drain conductive layer. The first electrode of the storage capacitor includes a first electrode plate located in the transfer layer, and the second electrode of the storage capacitor includes a second plate electrode located in the semiconductor layer and a third electrode plate located in the source-drain conductive layer, the second electrode plate is electrically connected to the third electrode plate.

In some embodiments, the display substrate further includes a light-emitting device electrically connected to a pixel circuit, and a second electrode auxiliary line extending in the second direction. An end of the light-emitting device is electrically connected to a third node of the pixel circuit, and another end of the light-emitting device is electrically connected to the second electrode auxiliary line.

In another aspect, a display apparatus is provided. The display apparatus includes the display substrate as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product to which the embodiments of the present disclosure relate.

DETAILED DESCRIPTION

Figure 1:
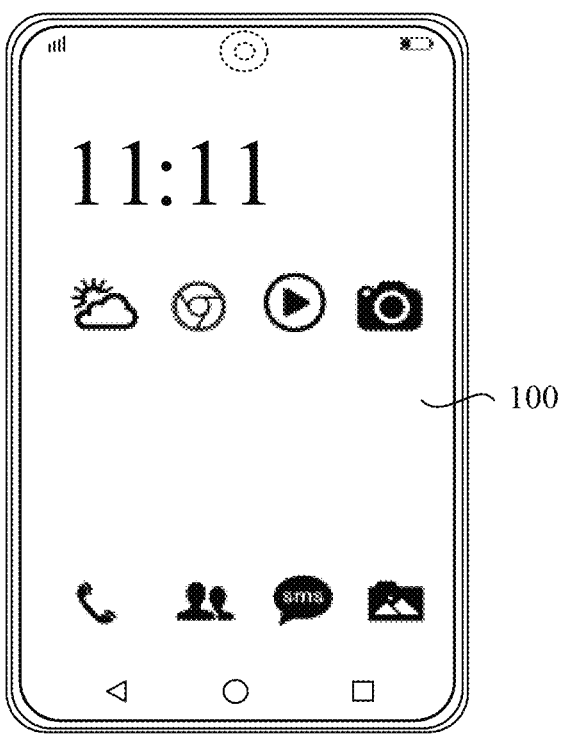
FIG. 1 is a structural diagram of a display apparatus, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "connected" and derivatives thereof may be used. For example, the term "connected" may be used in the description of some embodiments to indicate that two or more components are in direct physical or electrical contact with each other. The embodiments disclosed here are not necessarily limited to the content herein.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The phase "applicable to" or "configured to" as used herein indicates an open and inclusive expression, which does not exclude apparatuses that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "perpendicular" includes absolute perpendicularity and approximate perpendicularity, and an acceptable range of deviation of the approximate perpendicularity may be a deviation within 5°; and the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

In a circuit structure (a pixel circuit) provided in the embodiments of the present disclosure, transistors used in the circuit structure may be thin film transistors (TFTs), field effect transistors (e.g., metal-oxide-semiconductor (MOS) field effect transistors) or other switching devices with same properties, and the embodiments of the present disclosure are described by considering an example of the thin film transistors.

In the transistors used in the circuit structure provided in the embodiments of the present disclosure, a first electrode of each transistor is one of a source and a drain, and a second electrode of the transistor is the other of the source and the drain. Since the source and the drain of the transistor may be symmetrical in structure, there may be no difference in structure between the source and the drain of the transistor. That is, a first electrode and a second electrode of a transistor in the embodiments of the present disclosure may be indistinguishable in structure. For example, in a case where the transistor is a P-type transistor, the first electrode of the transistor is a source, and the second electrode of the transistor is a drain. For another example, in a case where the transistor is an N-type transistor, the first electrode of the transistor is a drain, and the second electrode of the transistor is a source.

In the circuit structure provided in the embodiments of the present disclosure, nodes such as a first node and a second node do not represent actual components, but represent junctions of related electrical connections in a circuit diagram. That is, these nodes are nodes equivalent to the junctions of the related electrical connections in the circuit diagram.

In the circuit structure provided by the embodiments of the present disclosure, the transistors may all be N-type transistors or all be P-type transistors; alternatively, some of the transistors are N-type transistors, and the other of the transistors are N-type transistors. In the present disclosure, "active level" refers to a level capable of turning on a transistor. The P-type transistor may be turned on under control of a low-level signal, and the N-type transistor may be turned on under control of a high-level signal.

Hereinafter, the circuit in the embodiments of the present disclosure will be exemplarily described by considering an example where the transistors are all N-type transistors.

Some embodiments of the present disclosure provide a display substrate 100 and a display apparatus 1000, and the display substrate 100 and the display apparatus 1000 are respectively described below.

Some embodiments of the present disclosure provide the display apparatus 1000. As shown in FIG. 1, the display apparatus 1000 may be any apparatus that displays images whether in motion (e.g., a video) or stationary (e.g., a still image), and regardless of text or image. More specifically, it is expected that the display apparatus in the embodiments may be implemented in or associated with a plurality of electronic devices. The plurality of electronic devices may include (but is not limit to), for example, mobile telephones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat panel displays, computer monitors, car displays (such as odometer displays), navigators, cockpit controllers and/or displays, camera view displays (such as rear view camera displays in vehicles), electronic photos, electronic billboards or signs, projectors, architectural structures, packaging and aesthetic structures (such as displays for displaying an image of a piece of jewelry), etc.

In some embodiments, as shown in FIG. 1, the display apparatus 1000 includes the display substrate 100.

For example, the display apparatus 1000 further includes a frame, a display driver integrated circuit (IC) and other electronic components.

For example, the display driver IC may provide data signals for the display substrate 100, and the data signals include display data signals and sensing data signals, etc. Thus, the display brightness of the display substrate 100 may be controlled by using the display data signals.

Figure 2:
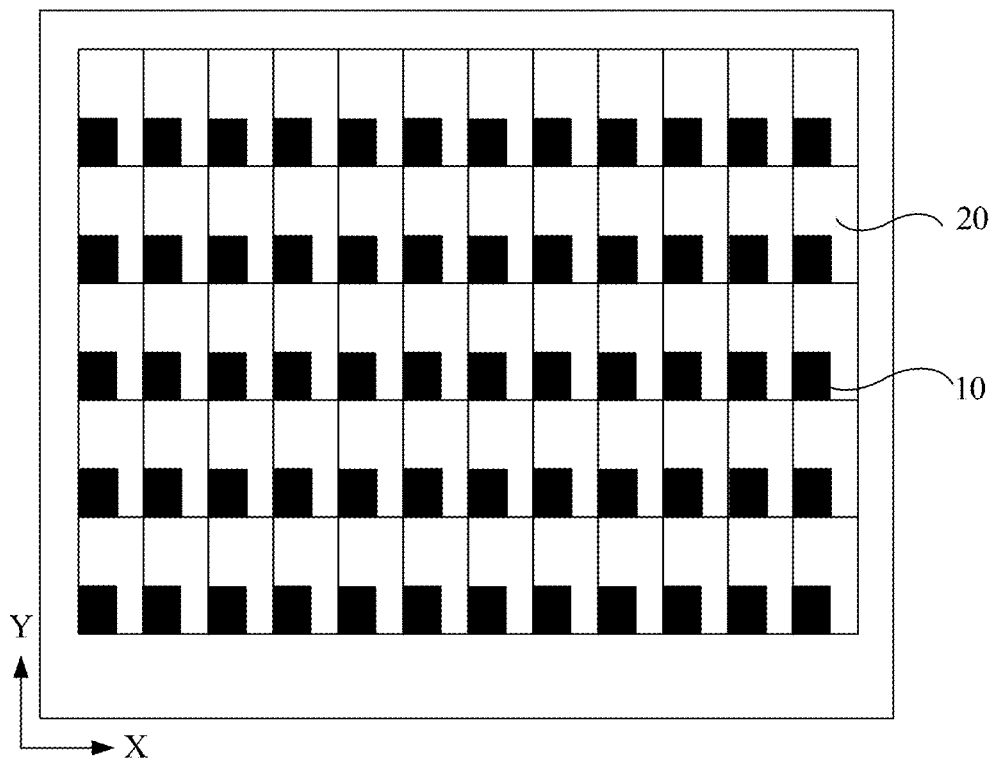
FIG. 2 is a structural diagram of a display substrate, in accordance with some embodiments of the present disclosure.

In some embodiments, as shown in FIG. 2, the display substrate 100 includes a plurality of pixel circuits 10 and a plurality of light-emitting devices 20.

For example, the plurality of pixel circuits 10 and the plurality of light-emitting devices 20 may be electrically connected in one-to-one correspondence. As another example, a single pixel circuit 10 may be electrically connected to multiple light-emitting devices 20; alternatively, multiple pixel circuits 10 may be electrically connected to a single light-emitting device 20.

Hereinafter, the structure of the display substrate 100 in the embodiments of the present disclosure will be exemplarily described by considering an example where a single pixel circuit 10 is electrically connected to a single light-emitting device 20.

For example, each light-emitting device 20 in the display substrate 100 may emit light under drive of a corresponding pixel circuit 10, and lights emitted by the plurality of light-emitting devices 20 cooperate with one another, so that the display substrate 100 realizes the display function.

For example, the light-emitting device 20 may include an organic light-emitting diode (OLED) device, a light-emitting diode (LED) device, or the like.

The embodiments of the present disclosure are described by considering an example where the light-emitting device 20 is the OLED device.

Figure 3:
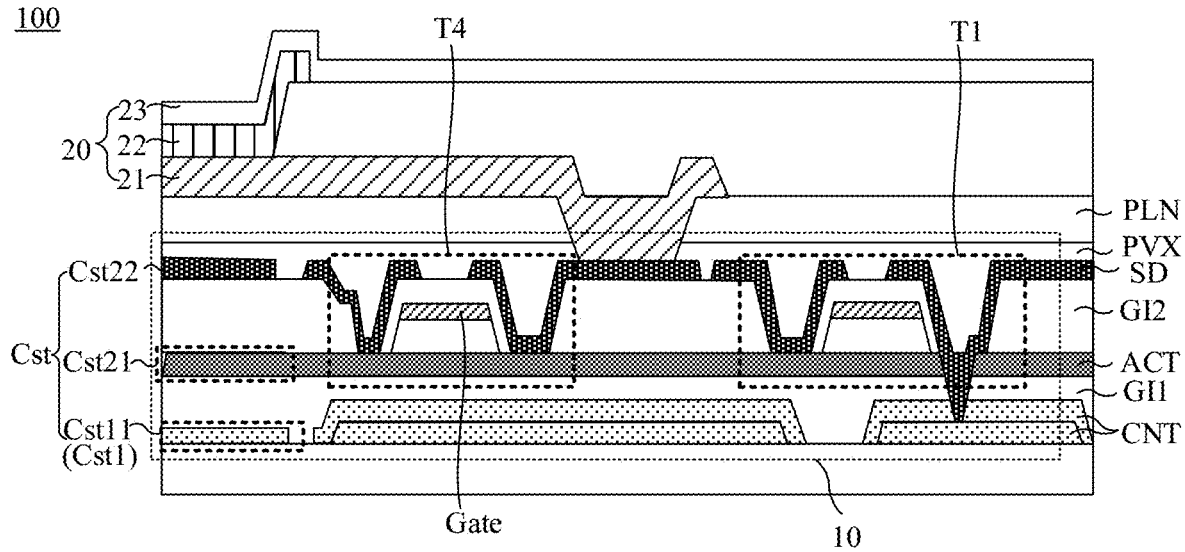
FIG. 3 is a structural diagram of another display substrate, in accordance with some embodiments of the present disclosure.

For example, as shown in FIG. 3, the light-emitting device 20 may include a first electrode 21, a light-emitting functional layer 22 and a second electrode 23 that are stacked in sequence. The light-emitting functional layer 22 may include a light-emitting layer. Optionally, the light-emitting functional layer 22 may further include at least one of a hole injection layer, a hole transport layer, an electron transport layer and an electron injection layer.

For example, the first electrode 21 may be one of an anode and a cathode, and the second electrode 23 may be the other of the anode and the cathode, which is not limited in the present disclosure.

Hereinafter, the embodiments of the present disclosure are described by considering an example where the first electrode 21 is the anode and the second electrode 23 is the cathode.

A common voltage is applied to the second electrode 23 of the light-emitting device 20, and a driving voltage is applied to the first electrode 21 of the light-emitting device 20 by using the corresponding pixel circuit 10, so that an electric field may be generated between the first electrode 21 and the second electrode 23. The electric field may drive different carriers (i.e., holes and electrons) to recombine in the light-emitting layer, so that the light-emitting device 20 emits light.

For example, the pixel circuit 10 and the light-emitting device 20 electrically connected thereto constitute a sub-pixel of the display substrate 100. The larger the density of the sub-pixels of the display substrate 100, (i.e., the higher the pixel per inch (PPI, pixel density) of the display substrate 100), the clearer the image displayed on the display substrate 100, and the better the display effect of the display substrate 100.

Figure 4A:
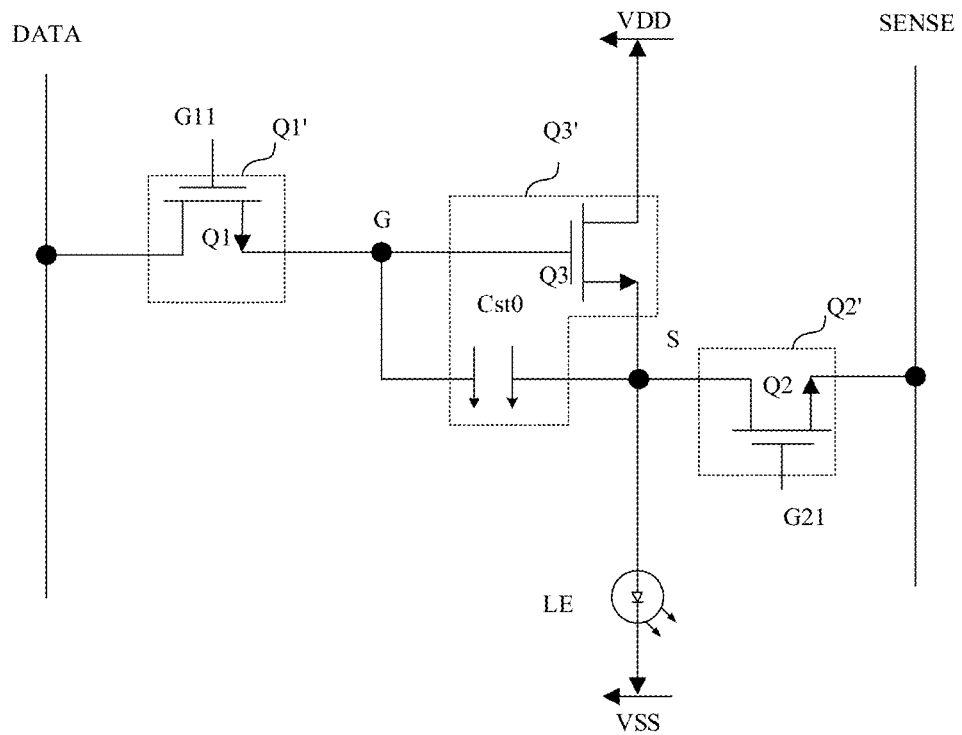
FIG. 4a is a structural diagram of a pixel circuit in an implementation.
Figure 4B:
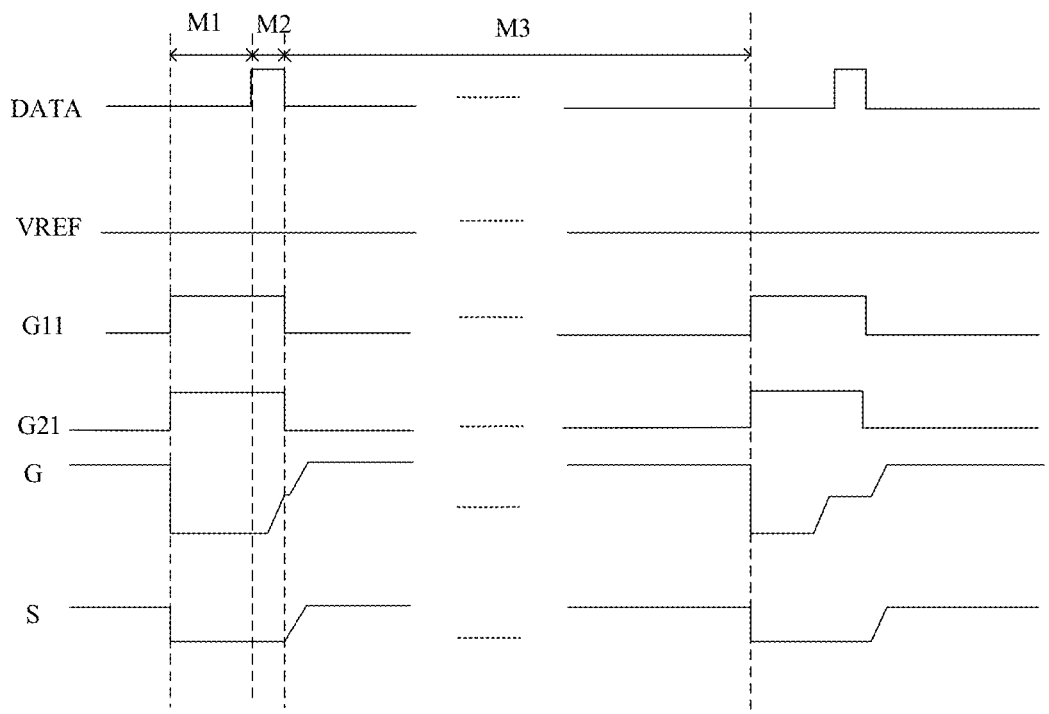
FIG. 4b is a timing diagram of a pixel circuit in an implementation.

In an implementation, as shown in FIG. 4a, the pixel circuit in the display substrate may include a switch circuit Q1' (e.g., including a switching transistor Q1), a sensing circuit Q2' (e.g., including a sensing transistor Q2), a driving circuit Q3' (e.g. including drive transistor Q3). FIG. 4b shows a timing diagram corresponding to the pixel circuit. An image frame (1 Frame) of the display substrate includes a reset phase M1, a data writing phase (Write data) M2 and a light-emitting phase (Emission) M3. It can be seen in combination with FIGS. 4a and 4b that, in the reset phase M1, the switch circuit Q1' is turned on under the control of a scan signal provided by a scan signal terminal G11 to write a low-level data signal provided by a data signal terminal DATA into a node G, so as to reset the node G. The sensing circuit Q2' is turned on under the control of a scan signal provided by another scan signal terminal G21 to transmit a reference voltage VREF provided by a sensing signal line SENSE to a node S, so as to reset the node S. In the data writing phase M2, the switch circuit Q1' is turned on under the control of the scan signal provided by the scan signal terminal G11 to transmit a high-level data signal provided by the data signal terminal DATA to the node G, so as to charge a capacitor Cst0. In the light-emitting phase, the switch circuit Q1' and the sensing circuit Q2' are turned off, and the driving circuit Q3' is turned on under the control of the node G to transmit a voltage signal provided by a driving voltage terminal VDD to the node S. Since the node S is electrically connected to the light-emitting device LE, so that the light-emitting device LE emits light due to action of both an electrical signal of the node S and a common voltage signal provided by the common voltage terminal VSS. The capacitor Cst0 is bootstrapped, so that the light-emitting device emits light. The luminance of the light-emitting device LE is controlled by adjusting the voltage of the data signal provided by the display driver IC. In a case of low-grayscale display, due to the accuracy of the display driver IC, during adjusting the display grayscale by using the voltage of the data signal, different levels of low-grayscale display cannot achieve significant differences, which in turn makes the luminance of the light-emitting device LE not change significantly between different grayscales, or causes the problem that human eyes cannot recognize the change of grayscale or brightness.

Figure 5:
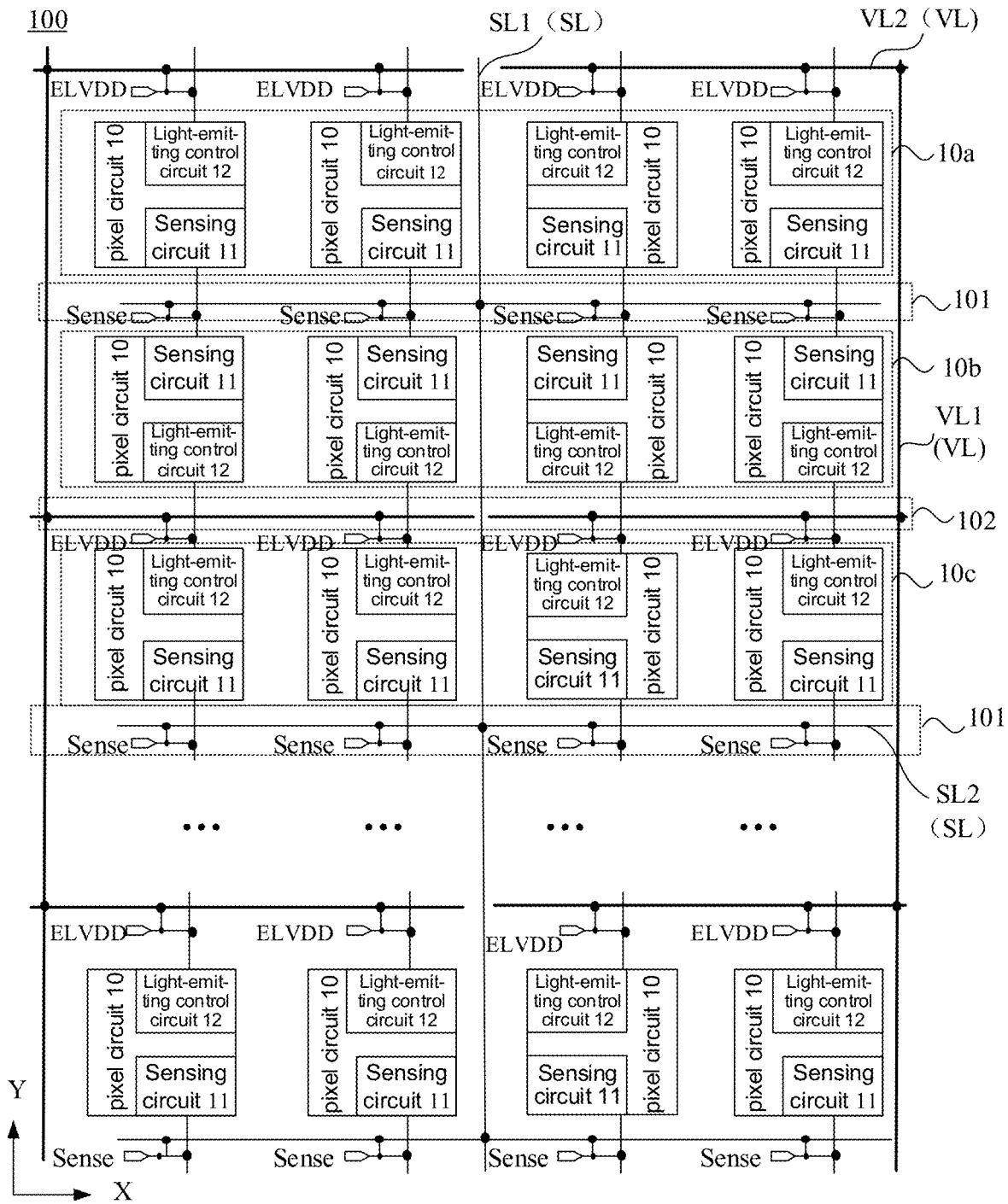
FIG. 5 is a structural diagram of yet another display substrate, in accordance with some embodiments of the present disclosure.

In light of this, some embodiments of the present disclosure provide a display substrate 100. As shown in FIG. 5, a plurality of pixel circuits 10 in the display substrate 100 are arranged in a plurality of columns in a first direction X, and arranged in a plurality of rows in a second direction Y.

For example, an included angle between the first direction X and the second direction Y may vary, and the included angle may be 80°, 85°, 90°, 95°, or the like.

The embodiments of the present disclosure are described by considering an example where the included angle between the first direction X and the second direction Y is 90°.

In some examples, as shown in FIG. 5, the pixel circuit 10 includes a sensing circuit 11 and a light-emitting control circuit 12.

For example, the pixel circuit 10 may further include other circuit structures, such as a switch circuit 13 and a driving circuit 14.

For example, the light-emitting control circuit 12 in the pixel circuit 10 may be electrically connected to the sensing circuit 11 through other circuit structures (such as the driving circuit 14).

Optionally, an output terminal of the switch circuit 13 is electrically connected to a control terminal of the driving circuit 14, an output terminal of the light-emitting control circuit 12 is electrically connected to an input terminal of the driving circuit 14, and an output terminal of the driving circuit 14 is electrically connected to an output terminal of the sensing circuit 11.

For example, as shown in FIG. 5, the sensing circuit 11 includes a sensing signal terminal Sense.

For example, the sensing signal terminal Sense may sense an electrical signal in another circuit structure in the pixel circuit 10 through the sensing circuit 11. Alternatively, the sensing signal terminal Sense may transmit a reference voltage signal to another circuit structure in the pixel circuit 10 (such as the output terminal of the driving circuit 14) for reset.

For example, the light-emitting control circuit 12 includes a first voltage signal terminal ELVDD. The first voltage signal terminal ELVDD is, for example, electrically connected to an input terminal of the light-emitting control circuit 12.

For example, the first voltage signal terminal ELVDD receives a first voltage signal, and the light-emitting control circuit 12 transmits the first voltage signal to other circuit structure(s) in the pixel circuit 10. Specifically, the input terminal of the light-emitting control circuit 12 receives the first voltage signal, and the output terminal of the light-emitting control circuit 12 outputs the first voltage signal to the input terminal of the driving circuit 14.

By adopting the above provision manner, the light-emitting control circuit 12 is provided in the pixel circuit 10, so that the light-emitting control circuit 12 may be used to control the turn-on or turn-off of a path between the first voltage signal terminal ELVDD and the drive circuit 14, so that the above light-emitting phase may be divided into a first light-emitting sub-phase and a second light-emitting sub-phase. In the first light-emitting sub-phase, the light-emitting control circuit 12 controls the path between the first voltage signal terminal ELVDD and the driving circuit 14 to be turned on, thereby making the light-emitting device 20 emit light normally. In the second light-emitting sub-phase, the light-emitting control circuit 12 controls the path between the first voltage signal terminal ELVDD and the driving circuit 14 to be turned off, thereby making the light-emitting device not emit light. In this way, in a case where the display substrate performs low-grayscale display, a ratio of the duration of black insertion process to the duration of the light-emitting phase may be controlled to adjust the low grayscale, the black insertion process (i.e., the connection between the light-emitting device and the pixel circuit is disconnected, so that the light-emitting device does not emit light) is performed by the light-emitting control circuit 12 in the second light-emitting sub-phase. Therefore, the light-emitting control circuit 12 may be combined with the data signal to adjust the low grayscale display, so that the brightness of the light-emitting device under low grayscale display may be sensitively adjusted.

In another implementation, the display substrate includes a plurality of pixel circuits. The plurality of pixel circuits are arranged in a plurality of rows and a plurality of columns. The pixel circuit includes a switch circuit, a sensing circuit, a driving circuit and a light-emitting control circuit. The layout arrangement of pixel circuits in a row is the same as the layout arrangement of pixel circuits in an adjacent row. The sensing signal terminal of each pixel circuit in each row of pixel circuits is independently set, and the first voltage signal terminal of each pixel circuit in each row of pixel circuits is also independently set.

Figure 6:
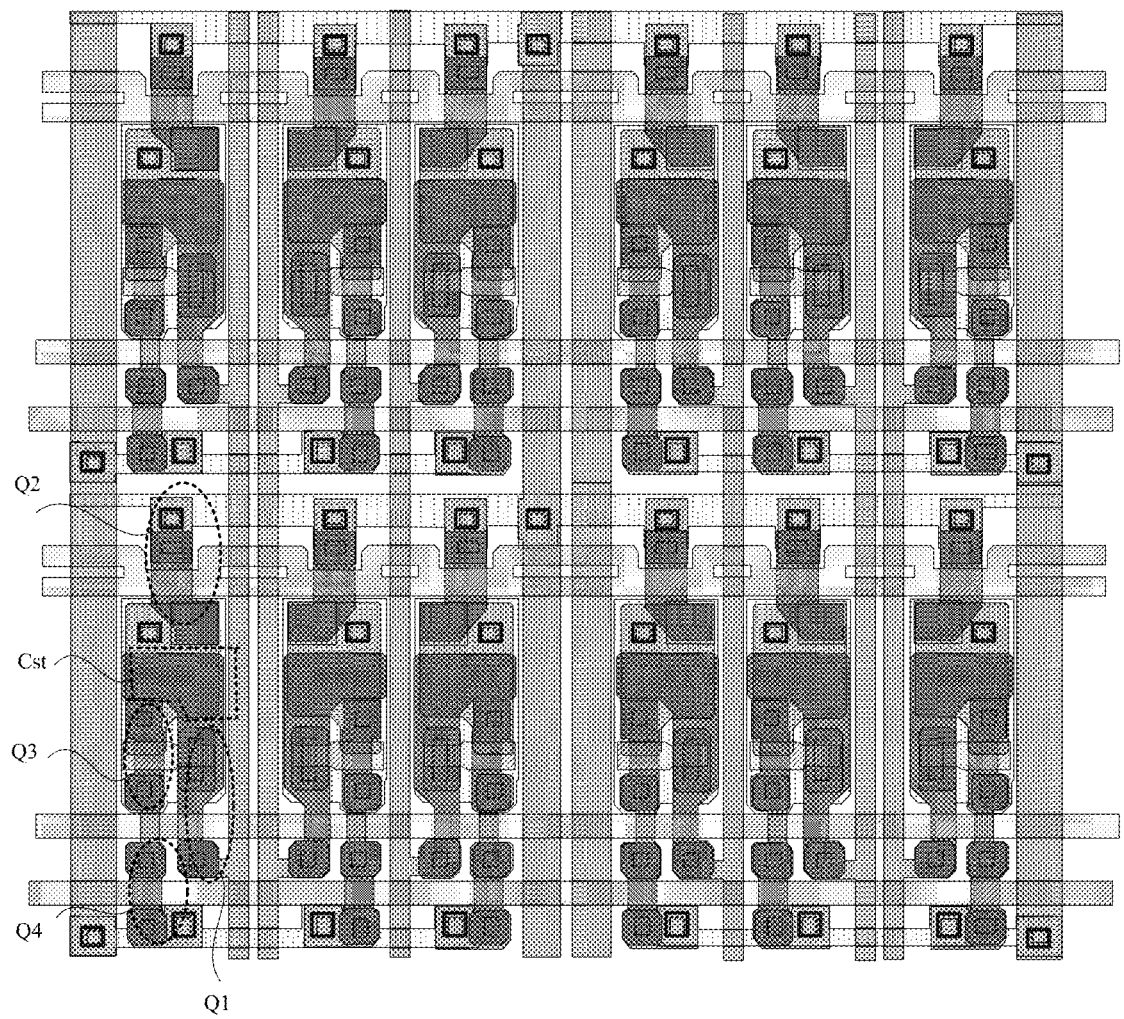
FIG. 6 is a structural diagram of a display substrate in another implementation.

Considering the pixel circuit being "4T1C" structure as an example, compared with the pixel circuit of "3T1C" structure in the above implementation, a light-emitting control transistor Q4 is added in the pixel circuit. FIG. 6 shows the layout arrangement of the transistors and the capacitor in the pixel circuit. In order to ensure that the display substrate has a relatively high pixel density, it is necessary to reduce an area of other structure(s) in the pixel circuit, such as the area of the capacitor. In the layout arrangement of the pixel circuit shown in FIG. 6, the area of the capacitor is only (14 μm×32 μm), which is equal to 448 μm². However, the small area of the capacitor is prone to cause insufficient capacitance of the capacitor and insufficient storage capacity, which in turn makes the pixel circuit easy to leak electricity, thus making the display substrate and the display apparatus prone to flicking.

In light of this, some embodiments of the present disclosure provide a layout arrangement of pixel circuits 10 in the display substrate 100.

In some examples, as shown in FIG. 5, in the second direction Y, any three adjacent rows of pixel circuits 10 are respectively a first row of pixel circuits 10*a*, a second row of pixel circuits 10*b*, and a third row of pixel circuits 10*c*. A region between the first row of pixel circuits 10*a* and the second row of pixel circuits 10*b* is a first gap region 101, and a region between the second row of pixel circuits 10*b* and the third row of pixel circuits 10*c* is a second gap region 102.

For example, the display substrate 100 may include a plurality of first gap regions 101 and a plurality of second gap regions 102. The plurality of first gap regions 101 and the plurality of second gap regions 102 are arranged alternately, that is, a second gap region 102 is provided in two adjacent first gap regions 101, and a first gap region 101 is provided in two adjacent second gap regions 102.

In some examples, as shown in FIG. 5, in the first row of pixel circuits 10*a* and the second row of pixel circuits 10*b*, the sensing circuit 11 of each pixel circuit 10 is closer to the first gap region 101 than the light-emitting control circuit 12 of each pixel circuit 10, and the sensing signal terminals Sense of the sensing circuits 11 of the two pixel circuits 10 in the same column are the same signal terminal.

For example, in the first row of pixel circuits 10*a* and the second row of pixel circuits 10*b*, the sensing circuit 11 of each pixel circuit 10 is closer to the first gap region 101, and the light-emitting control circuit 12 of each pixel circuit 10 is farther away from the first gap region 101. The sensing circuits 11 of the two pixel circuits 10 in the same column gap region 101 use the same sensing signal terminal Sense to sense the electrical signal or transmit the reference voltage signal.

With the above provision manner, the two pixel circuits 10 in the same column among the first row of pixel circuits 10*a* and the second row of pixel circuits 10*b* in the display substrate 100, that is, the pixel circuits in two adjacent rows in the same column, may share a sensing signal terminal Sense, so that the first row of pixel circuits 10*a* and the second row of pixel circuits 10*b* in the display substrate 100 may each save an area occupied by half of the sensing signal terminal Sense, thereby reducing an area occupied by the pixel circuit, reducing an area occupied by the sub-pixel, and increasing the density of the sub-pixels in the display substrate 100, which is conducive to realizing a high pixel per inch (PPI, pixel density) design of the display substrate, and further improving the display effect of the display substrate 100. In addition, the saved area may also be used for the layout of another structure (such as the layout of the storage capacitor Cst mentioned below) in the pixel circuit 10, so that an area of the another structure (such as the storage capacitor Cst mentioned below) in the pixel circuit 10 may be enlarged, thereby improving the working state of the pixel circuit 10 and improving the display quality of the display substrate 100.

In some examples, as shown in FIG. 5, in the second row of pixel circuits 10*b* and the third row of pixel circuits 10*c*, the light-emitting control circuit 12 of each pixel circuit 10 is closer to the second gap region 102 than the sensing circuit 11 of each pixel circuit 10, and the first voltage signal terminals ELVDD of the light-emitting control circuits 12 of the two pixel circuits 10 in the same column are the same signal terminal.

For example, in the second row of pixel circuits 10*b* and the third row of pixel circuits 10*c*, the light-emitting control circuit 12 of each pixel circuit 10 is closer to the second gap region 102, and the sensing circuit 11 of each pixel circuit 10 is farther away from the second gap region 102. The light-emitting control circuits 12 of the two pixel circuits 10 in the same column use the same first voltage signal terminal ELVDD to transmit the first voltage signal, and the same first voltage signal terminal ELVDD may be electrically connected to the same first voltage signal line.

With the above provision manner, the two pixel circuits 10 in the same column among the second row of pixel circuits 10*b* and the third row of pixel circuits 10*c* in the display substrate 100 may share a first voltage signal terminal ELVDD, so that the second row of pixel circuits 10*b* and the third row of pixel circuits 10*c* in the display substrate 100 may each save an area occupied by half of the first voltage signal terminal ELVDD, thereby reducing an area occupied by the pixel circuit 10, reducing an area occupied by the sub-pixels, and increasing the density of the sub-pixels in the substrate 100, and further improving the PPI of the display substrate, and further improving the display effect of the display substrate 100. In addition, the saved area may also be used for the layout of another structure (such as the layout of the storage capacitor Cst mentioned below) in the pixel circuit, so that an area of the another structure (such as the storage capacitor Cst mentioned below) in the pixel circuit may be enlarged, thereby improving the working state of the pixel circuit and improving the display quality of the display substrate.

In some examples, as shown in FIG. 5, in the first row of pixel circuits 10a and the second row of pixel circuits 10b, the sensing circuit 11 of each pixel circuit 10 is closer to the first gap region 101 than the light-emitting control circuit 12 of each pixel circuit 10, and the sensing signal terminals Sense of the sensing circuits 11 of the two pixel circuits 10 in the same column are the same signal terminal. Moreover, in the second row of pixel circuits 10b and the third row of pixel circuits 10c, the light-emitting control circuit 12 of each pixel circuit 10 is closer to the second gap region 102 than the sensing circuit 11 of each pixel circuit 10, and the first voltage signal terminals ELVDD of the light-emitting control circuits 12 of the two pixel circuits 10 in the same column are the same signal terminal.

With the above provision manner, the two pixel circuits 10 in the same column among the first row of pixel circuits 10a and the second row of pixel circuits 10b in the display substrate 100 may share a sensing signal terminal Sense, so that the first row of pixel circuits 10a and the second row of pixel circuits 10b in the display substrate 100 may each save an area occupied by half of the sensing signal terminal Sense, thereby reducing the area occupied by the pixel circuit and reducing the area occupied by the sub-pixel. Moreover, the two pixel circuits 10 in the same column among the second row of pixel circuits 10b and the third row of pixel circuits 10c in the display substrate 100 may share a first voltage signal terminal ELVDD, so that the second row of pixel circuits 10b and the third row of pixel circuits 10c in the display substrate 100 may each save an area occupied by half of the first voltage signal terminal ELVDD, thereby reducing the area occupied by the pixel circuit 10 and reducing the area occupied by the sub-pixel. Further, it may be possible to increase the density of the sub-pixels in the display substrate 100, which is conducive to realizing the high pixel per inch (PPI, pixel density) design of the display substrate, and further improving the display effect of the display substrate 100. In addition, the saved areas occupied by half of the sensing signal terminal Sense and half of the first voltage signal terminal ELVDD may also be used for the layout of another structure (such as the layout of the storage capacitor Cst mentioned below) in the pixel circuit 10, so that the area of the another structure (such as the storage capacitor Cst mentioned below) in the pixel circuit 10 may be enlarged, thereby improving the working state of the pixel circuit 10 and improving the display quality of the display substrate 100.

Figure 7:
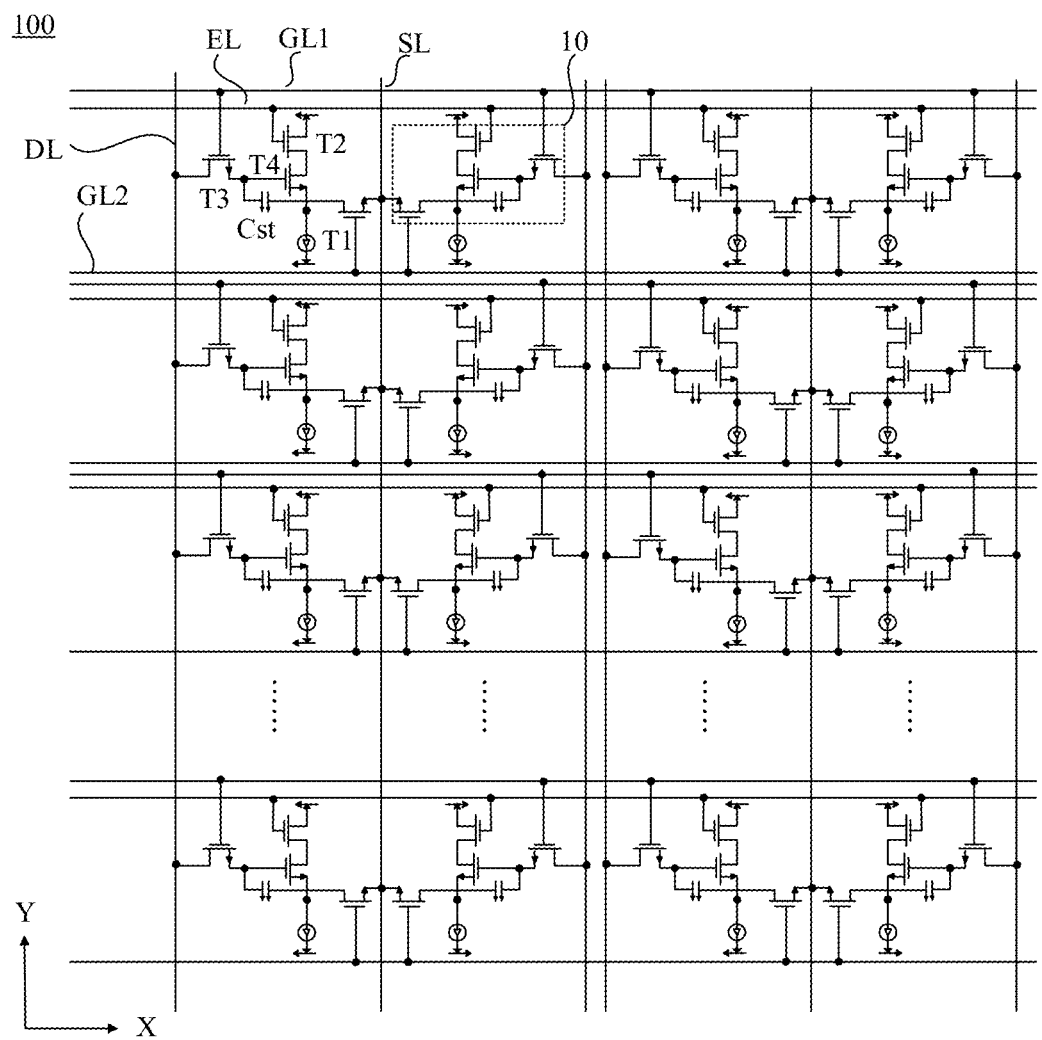
FIG. 7 is a structural diagram of yet another display substrate, in accordance with some embodiments of the present disclosure.
Figure 8:
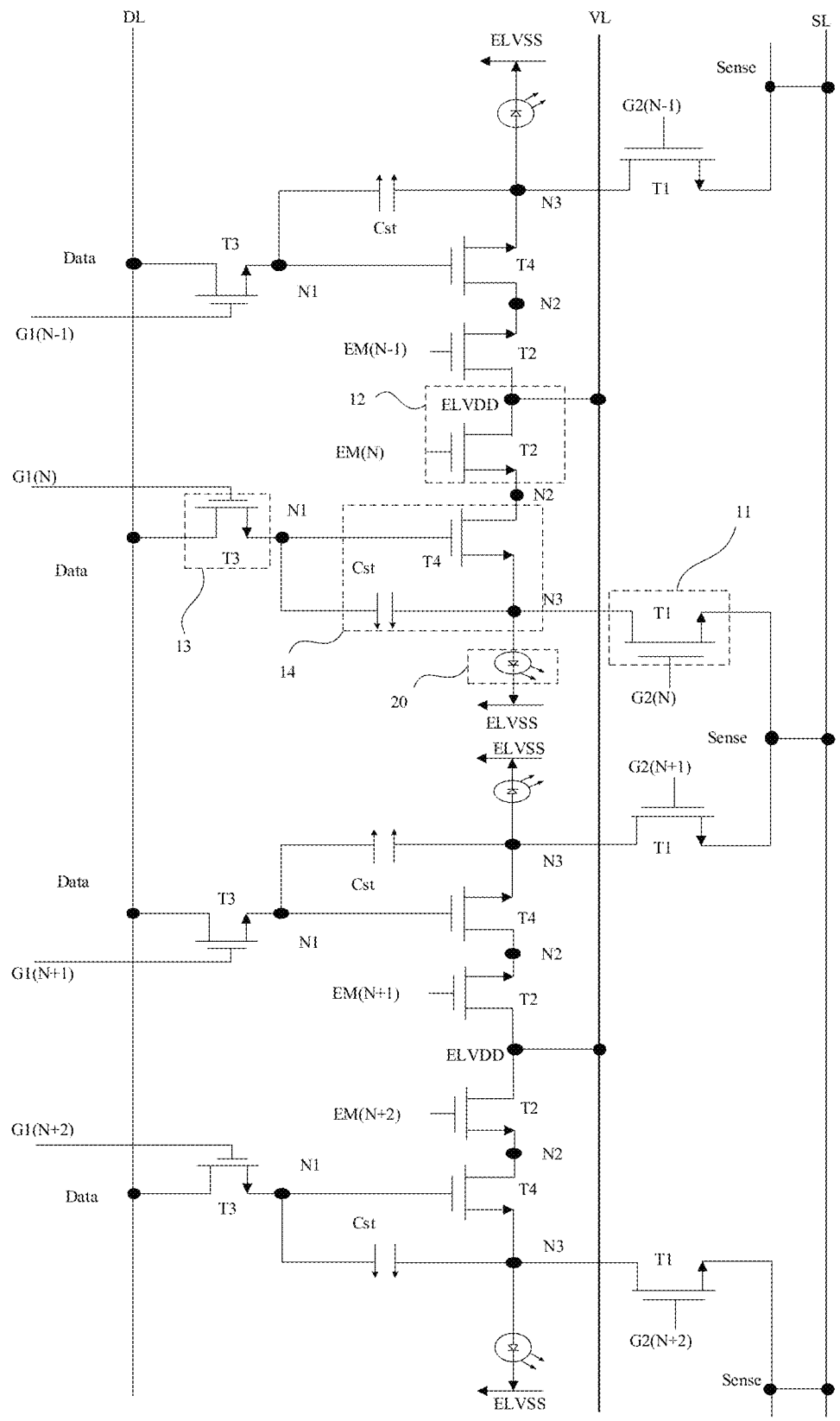
FIG. 8 is a structural diagram of another pixel circuit, in accordance with some embodiments of the present disclosure.

In some embodiments, as shown in FIGS. 7 and 8, the display substrate 100 further includes first scan signal lines GL1, second scan signal lines GL2, data signal lines DL, enable signal lines EL, sensing signal lines SL, and first voltage signal lines VL.

For example, as shown in FIG. 8, the first scan signal line GL1 is electrically connected to the first scan signal terminal G1 (N−1), G1 (N), G1 (N+1), or G1 (N+2), and may provide a first scan signal for the pixel circuit 10. The second scan signal line GL2 is electrically connected to the second scan signal terminal G2 (N−1), G2 (N), G2 (N+1), or G2 (N+2), and may provide a second scan signal for the pixel circuit 10. The data signal line DL is electrically connected to the data signal terminals Data, and may provide a data signal for the pixel circuits 10. The enable signal line EL is electrically connected to the enable signal terminal EM (N−1), EM (N), EM (N+1), or EM (N+2), and may provide an enable signal for the pixel circuit 10.

It will be noted that, in the pixel circuits 10 shown in FIG. 8, G1 (N) is used to represent a first scan signal terminal of a pixel circuit 10 in the Nth row, G2 (N) is used to represent a second scan signal terminal of a pixel circuit 10 in the Nth row, and EM (N) is used to represent an enable signal terminal of a pixel circuit 10 in the Nth row. Accordingly, by analogy, G1 (N−1) is used to represent a first scan signal terminal of a pixel circuit 10 in the (N−1)th row, G2 (N−1) is used to represent a second scan signal terminal of a pixel circuit 10 in the (N−1)th row, and EM (N−1) is used to represent an enable signal terminal of a pixel circuit 10 in the (N−1)th row. For the convenience of description, the pixel circuits mentioned below are the pixel circuits in the Nth row in FIG. 8, G1 (N) is used to represent the first scan signal terminal of the sub-pixels in the Nth row, G2 (N) is used to represent the second scan signal terminal of the sub-pixels in the Nth row, and EM (N) is used to represent the enable signal terminal of the sub-pixels in the Nth row, and details will not be repeated.

For example, the sensing signal line SL is electrically connected to the sensing signal terminal Sense, and may receive a sensing signal of the pixel circuit 10 or provide a reference voltage signal for the pixel circuit 10. The first voltage signal line VL is electrically connected to the first voltage signal terminal ELVDD, and may provide a first voltage signal for the pixel circuit 10.

For example, as shown in FIG. 8, the switch circuit 13 is electrically connected to the first scan signal terminal G1 (N), the data signal terminal Data and a first node N1. The switch circuit 13 is configured to transmit the data signal provided by the data signal line DL to the first node N1 under control of the first scan signal provided by the first scan signal line GL1.

For example, in a case where the first scan signal is at an active level, the switch circuit 13 may be turned on under the control of the first scan signal to transmit the data signal to the first node N1.

For example, the light-emitting control circuit 12 is electrically connected to the enable signal terminal EM (N), the first voltage signal terminal ELVDD and a second node N2. The light-emitting control circuit 12 is configured to transmit the first voltage signal provided by the first voltage signal line VL to the second node N2 under control of the enable signal provided by the enable signal line EL.

For example, in a case where the enable signal is at an active level, the light-emitting control circuit 12 may be turned on under the control of the enable signal to transmit the first voltage signal to the second node N2.

For example, the driving circuit 14 is electrically connected to the first node N1, the second node N2 and a third node N3. The driving circuit 14 is configured to transmit an electrical signal of the second node N2 to the third node N3 under control of an electrical signal of the first node N1.

For example, in a case where the electrical signal of the first node N1 is at an active level, the driving circuit 14 may be turned on under the control of the electrical signal of the first node N1 to transmit the electrical signal of the second node N2 to the third node N3.

For example, the sensing circuit 11 is electrically connected to the second scan signal terminal G2 (N), the sensing signal terminal Sense and the third node N3. The sensing circuit 11 is configured to, under control of the second scan signal provided by the second scan signal line GL2, transmit the reference voltage signal provided by the sensing signal line SL to the third node N3, or detect an electrical signal of the third node N3 through the sensing signal line SL, so as to realize external compensation.

For example, in a case where the second scan signal is at an active level, the sensing circuit 11 may be turned on under the control of the second scan signal to transmit the reference voltage signal to the third node N3; alternatively, the sensing circuit 11 may be turned on under the control of the second scan signal to transmit the electrical signal of the third node N3 such as the sensing signal to the sensing signal line SL.

For example, structures of the switch circuit 13, the sensing circuit 11, the light-emitting control circuit 12 and the driving circuit 14 in the pixel circuit 10 may vary, and may be set according to actual needs, which is not limited in the present disclosure.

In some embodiments, as shown in FIG. 8, the sensing circuit 11 includes a first transistor T1.

For example, a gate of the first transistor T1 is electrically connected to the second scan signal terminal G2 (N), a first electrode of the first transistor T1 is electrically connected to the sensing signal terminal Sense, and a second electrode of the first transistor T1 is electrically connected to the third node N3.

For example, in the case where the second scan signal provided by the second scan signal line GL2 is at an active level, the first transistor T1 is turned on to transmit the reference voltage provided by the sensing signal line SL to the third node N3, or transmit the sensing signal of the third node N3 to the sensing signal line SL.

In some examples, as shown in FIG. 8, the light-emitting control circuit 12 includes a second transistor T2.

For example, a gate of the second transistor T2 is electrically connected to the enable signal terminal EM (N), a first electrode of the second transistor T2 is electrically connected to the first voltage signal terminal ELVDD, and a second electrode of the second transistor T2 is electrically connected to the second node N2.

For example, in the case where the enable signal provided by the enable signal line EL is at an active level, the second transistor T2 is turned on to transmit the first voltage signal provided by the first voltage signal line VL to the second node N2.

In some examples, as shown in FIG. 8, the switch circuit 13 includes a third transistor T3.

For example, a gate of the third transistor T3 is electrically connected to the first scan signal terminal G1 (N), a first electrode of the third transistor T3 is electrically connected to the data signal terminal Data, and a second electrode of the third transistor T3 is electrically connected to the first node N1.

For example, in the case where the first scan signal provided by the first scan signal line GL1 is at an active level, the third transistor T3 is turned on to transmit the data signal provided by the data signal line DL to the first node N1.

In some examples, as shown in FIG. 8, the driving circuit 14 includes a fourth transistor T4 and a storage capacitor Cst.

For example, a gate of the fourth transistor T4 is electrically connected to the first node N1, a first electrode of the fourth transistor T4 is electrically connected to the second node N2, and a second electrode of the fourth transistor T4 is electrically connected to the third node N3. A first electrode of the storage capacitor Cst is electrically connected to the first node N1, and a second electrode of the storage capacitor Cst is electrically connected to the third node N3.

For example, in the case where the electrical signal of the first node N1 is at an active level, the fourth transistor T4 is turned on to transmit the electrical signal of the second node N2 to the third node N3.

In an image frame, the working process of pixel circuit 10 may include, for example, a display period and a blanking period that are sequentially performed.

Figure 9:
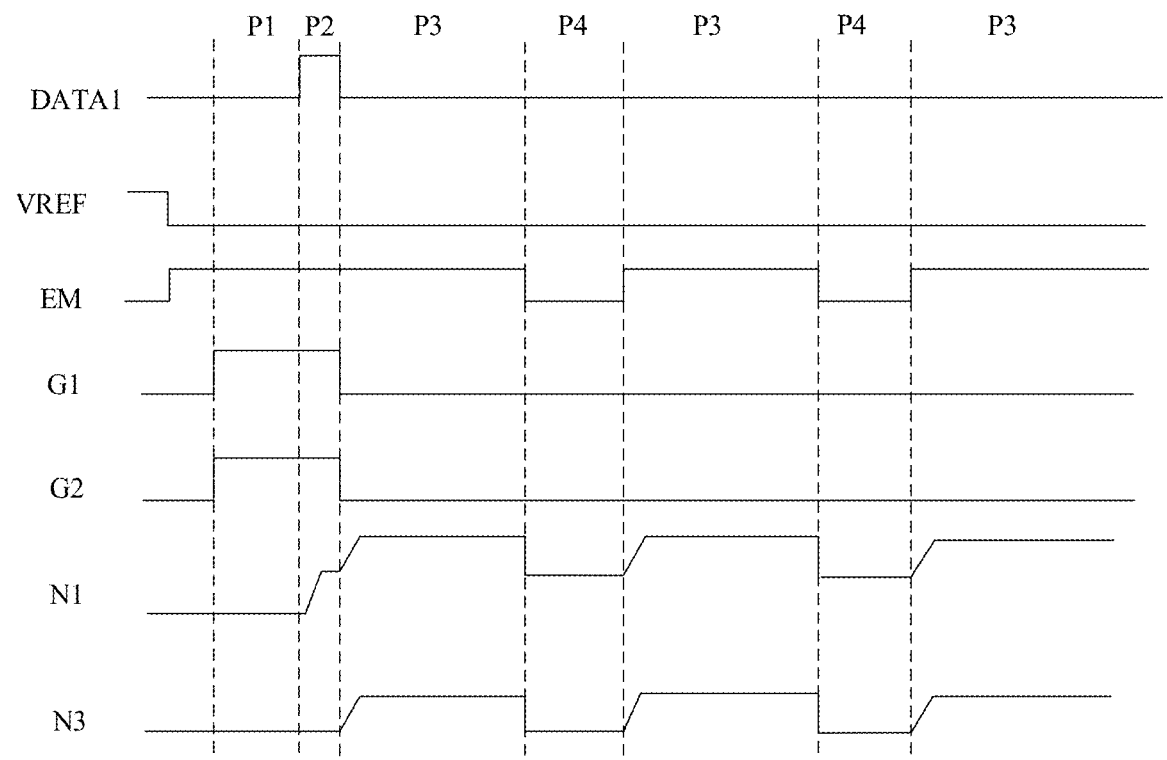
FIG. 9 is a timing diagram of a pixel circuit, in accordance with some embodiments of the present disclosure.

For example, as shown in FIG. 9, in the display period of the image frame, the working process of the pixel circuit 10 may include a reset phase P1, a data writing phase P2, and first light-emitting sub-phases P3 and second light-emitting sub-phases P4, the first light-emitting sub-phases P3 and the second light-emitting sub-phases are alternately performed.

It will be noted that in FIG. 9, DATA1 is used to represent a display data signal transmitted to the data signal terminal by the data signal line DL, VREF is used to represent the reference voltage signal transmitted to the sensing signal terminal by the sensing signal line SL, EM is used to represent the enable signal transmitted to the enable signal terminal by the enable signal line EL, G1 is used to represent the first scan signal transmitted to the first scan signal terminal by the first scan signal line GL1, G2 is used to represent the second scan signal transmitted to the second scan signal terminal by the second scan signal line GL2, N1 is used to represent the electrical signal of the first node, and N3 is used to represent the electrical signal of the third node.

In the reset phase P1, the first scan signal G1 provided by the first scan signal line GL1 is at a high level, the second scan signal G2 provided by the second scan signal line GL2 is at a high level, and the reference voltage signal VREF provided by the sensing signal terminal Sense is, for example, at a low level. The first transistor T1 is turned on under the control of the second scan signal G2 to receive the reference voltage signal VREF, and transmit the reference voltage signal VREF to the third node N3, so as to reset the third node N3. The third transistor T3 is turned on under the control of the first scan signal G1 to receive the display data signal DATA1, and transmit the display data signal DATA1 to the first node N1, so as to reset the first node N1.

In the data writing phase P2, the first scan signal G1 provided by the first scan signal line GL1 is at the high level, and the display data signal DATA1 provided by the data signal terminal Data is at a high level. The third transistor T3 is turned on under the control of the first scan signal G1 to receive the display data signal DATA1, transmit the display data signal DATA1 to the first node N1, and charge the storage capacitor Cst simultaneously.

In the first light-emitting sub-phase P3, the first scan signal G1 provided by the first scan signal line GL1 is at a low level, the second scan signal G2 provided by the second scan signal line GL2 is at a low level, the enable signal EM provided by the enable signal line EL is at a high level, and the first voltage signal provided by the first voltage signal line VL is at a high level. The third transistor T3 is turned off under the control of the first scan signal G1, and the first transistor T1 is turned off under the control of the second scan signal G2. The storage capacitor Cst starts to discharge, so that the voltage of the first node N1 remains at a high level. The second transistor T2 is turned on under the control of the enable signal EM to receive the first voltage signal, and transmit the first voltage signal to the second node N2. The fourth transistor T4 is turned on under the control of the voltage of the first node N1 to receive the electrical signal of the second node N2 (e.g., the first voltage signal), and transmit the electrical signal of the second node N2 to the third node N3, so that the light-emitting device 20 emits light under the cooperation of the electrical signal of the third node N3 (e.g., the first voltage signal) and a second voltage signal transmitted by the second voltage signal terminal ELVSS.

In the second light-emitting sub-phase P4, the enable signal EM provided by the enable signal line EL is at a low level. The second transistor T2 is turned off under the control of the enable signal to cut off the transmission of the first voltage signal, so that the first voltage signal cannot be transmitted to the light-emitting device 20, so that the light-emitting device 20 stops emitting light.

Figure 10:
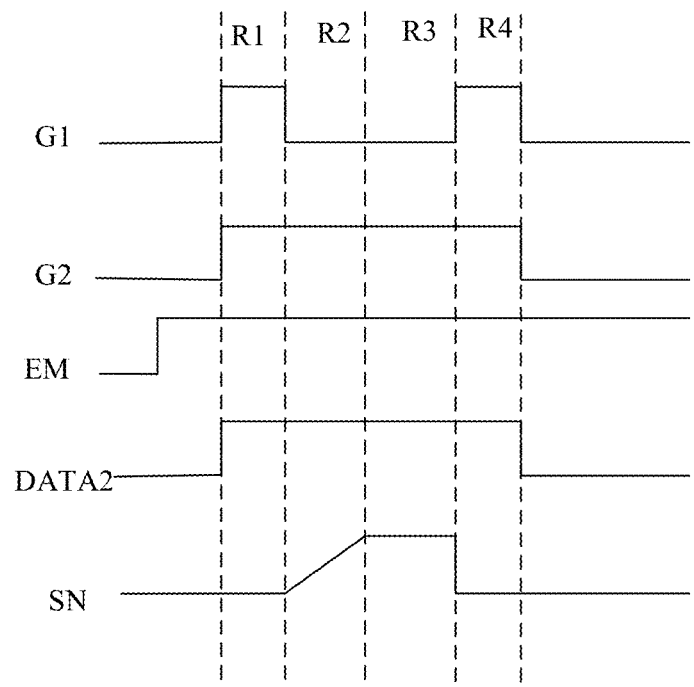
FIG. 10 is another timing diagram of a pixel circuit, in accordance with some embodiments of the present disclosure.

For example, as shown in FIG. 10, in the blanking period of the image frame, the working process of the pixel circuit 10 may include a writing phase R1, a charging phase R2, a sampling phase R3 and a writing back phase R4.

It will be noted that in FIG. 10, DATA2 is used to represent a detection data signal transmitted to the data signal terminal by the data signal line DL, SN is used to represent the sensing signal transmitted to the sensing signal line SL by the sensing signal terminal, EM is used to represent the enable signal transmitted to the enable signal terminal by the enable signal line, G1 is used to represent the first scan signal transmitted to the first scan signal terminal by the first scan signal line GL1, and G2 is used to represent the second scan signal transmitted to the second scan signal terminal by the second scan signal line GL2.

In the writing phase R1, the first scan signal G1 provided by the first scan signal line GL1 and the second scan signal G2 provided by the second scan signal line GL2 are both at high levels, and the detection data signal DATA2 transmitted by the data signal terminal Data is at a high level. The third transistor T3 is turned on under the control of the first scan signal G1 to receive the detection data signal DATA2, and transmit the detection data signal DATA2 to the first node N1, so as to charge the first node N1. The enable signal EM provided by the enable signal line EL is at a high level. The second transistor T2 is turned on under the control of the enable signal EM to transmit the first voltage signal to the second node N2.

In the charging phase R2, the first scan signal G1 provided by the first scan signal line GL1 is at a low level, the third transistor T3 is turned off, and the sensing signal terminal Sense is in a floating state. The fourth transistor T4 is turned on under the control of the electrical signal of the first node N1 to transmit the electrical signal of the second node N2 to the third node N3, so as to charge the third node N3 and the sensing signal terminal Sense.

In the sampling phase R3, the charging on the third node N3 and the sensing signal terminal Sense by the fourth transistor T4 ends, and the fourth transistor T4 is turned off. An analog-to-digital converter (ADC) samples the electrical signal of the sensing signal terminal Sense through the sensing signal line SL. The ADC calculates the threshold voltage Vth of the fourth transistor T4 according to the sampling result (in this case, a difference Vgs between the voltage of the first node N1 and the voltage of the third node N3 is equal to the threshold voltage Vth of the fourth transistor T4).

In the writing back phase R4, after the ADC obtains the threshold voltage of the fourth transistor T4 through calculation, the threshold voltage Vth may be compensated into a display data signal DATA1 in a display period of a next image frame, so that the external compensation for the sub-pixel 10 may be achieved.

For example, the arrangement of the transistors and the storage capacitor in pixel circuit 10 may vary, and may be set according to actual situations, which is not limited in the present disclosure.

Figure 11:
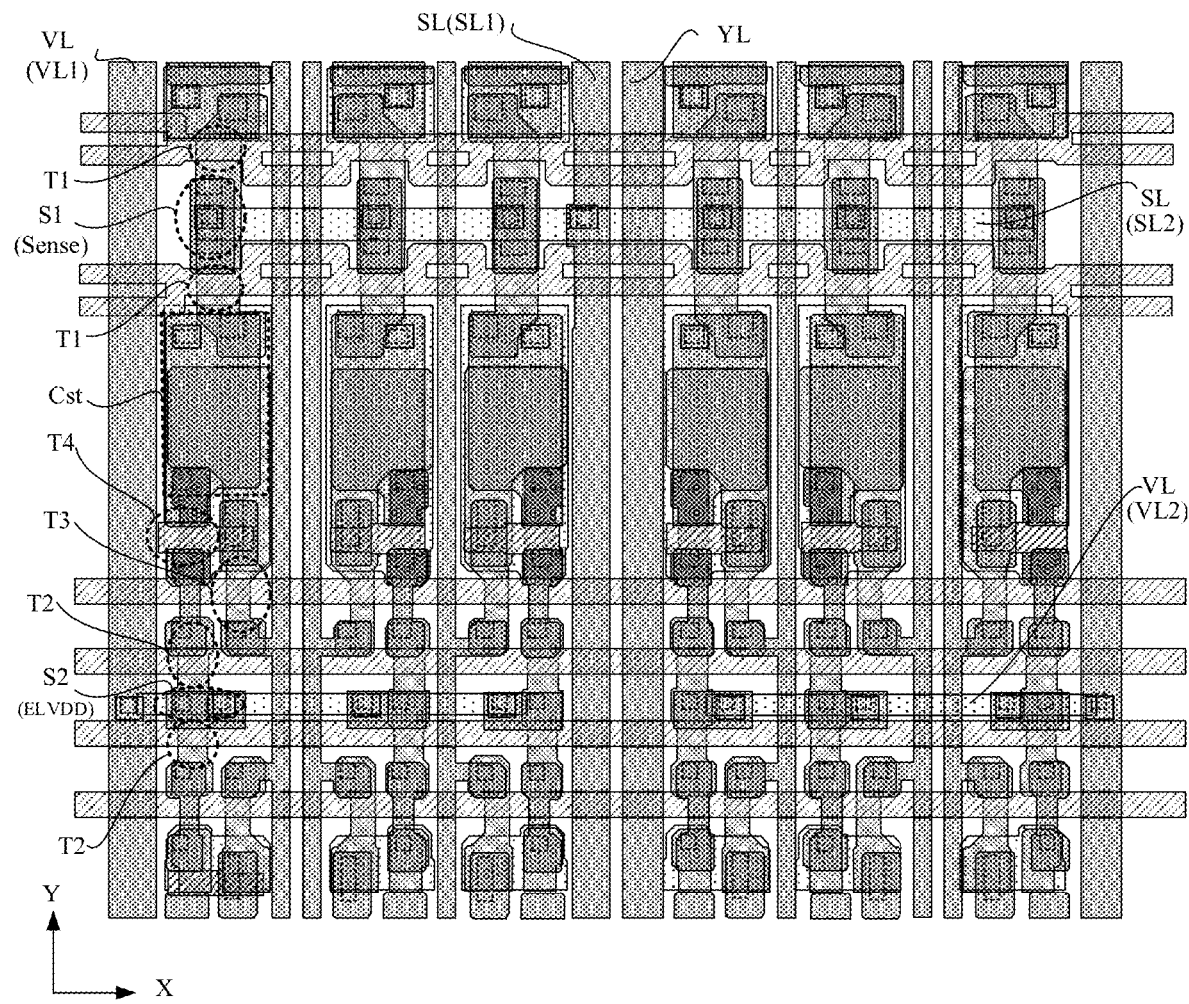
FIG. 11 is a top view of some layers in a display substrate, in accordance with some embodiments of the present disclosure.

In some embodiments, as shown in FIGS. 8 and 11, in the first row of pixel circuits 10a and the second row of pixel circuits 10b, the first electrodes of the first transistors T1 of the two sensing circuits 11 located in the same column are the same electrode, and constitute the sensing signal terminal Sense.

With the above provision manner, the first transistors T1 of the two pixel circuits in the display substrate may share the first electrode, so that the pixel circuit in the display substrate 100 may save an area occupied by half of the first electrode of the first transistor T1, thereby reducing an area occupied by the pixel circuit and an area occupied by the sub-pixel, and increasing the density of the sub-pixels in the display substrate 100, which is conducive to the high PPI design of the display substrate. Further, the display effect of the display substrate 100 may be improved. In addition, the saved area may also be used for the layout of another structure (e.g., the storage capacitor Cst) in the pixel circuit, so that an area of the another structure (e.g., the storage capacitor Cst) in the pixel circuit may be enlarged, thereby improving the working state of the pixel circuit 10 and improving the display quality of the display substrate.

In some embodiments, as shown in FIGS. 5 and 11, the sensing signal line SL includes a first sensing signal sub-line SL1 extending in the second direction Y, and a plurality of second sensing signal sub-lines SL2 each extending in the first direction X and electrically connected to the first sensing signal sub-line SL1.

For example, the connection positions between the second sensing signal sub-lines SL2 and the first sensing signal sub-line SL1 of the sensing signal line SL may vary.

For example, an end of each of the plurality of second sensing signal sub-lines SL2 may be used as the connection position, so as to realize the connection with the first sensing signal sub-line SL1.

As another example, another portion, except the end, of each of the plurality of second sensing signal sub-lines SL2 may be used as the connection position, so as to realize the connection with the first sensing signal sub-line SL1.

All the second sensing signal sub-lines SL2 of the sensing signal line SL and the first sensing signal sub-line SL1 may have the same or different connection positions.

For example, each second sensing signal sub-line SL2 may be arranged symmetrically with respect to the first sensing signal sub-line SL1 electrically connected thereto. In this case, the connection position between the second sensing signal sub-line SL2 and the first sensing signal sub-line SL1 is located at the center of the second sensing signal sub-line SL2.

For example, a second sensing signal sub-line SL2 is located in a first gap region 101, and the second sensing signal sub-line SL2 is electrically connected to the sensing signal terminals Sense of at least two columns of pixel circuits 10.

For example, a second sensing signal sub-line SL2 may be electrically connected to sensing signal terminals Sense of two, three, four or eight columns of pixel circuits 10.

By adopting the above provision manner, it is convenient to realize the nearby connection between the second sensing signal sub-line SL2 and the sensing signal terminal Sense, thereby preventing the second sensing signal sub-line SL2 from being electrically connected with the sensing signal terminal Sense by going across a plurality of other signal lines, and further avoiding existence of parasitic capacitances between the second sensing signal sub-line SL2 and the above other signal lines. Thus, the electrical signal transmitted on the second sensing signal sub-line SL2 may be prevented from being interfered by the electrical signals on the above other signal lines, and the accuracy of the electrical signal on the second sensing signal sub-line SL2 may be improved.

Moreover, the number of the second sensing signal sub-lines SL2 may be reduced. A relatively small number of first sensing signal sub-lines SL1 is used to achieve the electrical connection with multiple columns of pixel circuits 10, so that the number of the sensing signal lines SL may be reduced, thereby reducing the space or area occupied by the sensing signal lines SL in the display substrate 100, and providing a larger space for the layout of other signal lines or the storage capacitor Cst in the pixel circuit 10. Therefore, an area of the electrode plate of the storage capacitor Cst in the pixel circuit 10 may be enlarged, and the capacitance of the storage capacitor in the pixel circuit 10 may increase, thereby avoiding electricity leakage caused by insufficient capacitance of the storage capacitor, alleviating the flicker phenomenon of the display substrate 100, and improving the display quality of the display substrate 100.

In addition, the above provision manner reduces the number of the signal lines in the display substrate 100, so that short circuit or open circuit of the signal lines due to excessive signal lines may be alleviated, thereby improving the yield of the signal lines and improving the yield of the display substrate 100.

For example, the relative position between the at least two columns of pixel circuits 10 electrically connected to a second sensing signal sub-line SL2 and the first sensing signal sub-line SL1 electrically connected to the second sensing signal sub-line SL2 may vary, which is not limited in the present disclosure and may be set according to actual needs.

In some examples, as shown in FIGS. 5 and 11, the at least two columns of pixel circuits 10 are located on opposite sides of the first sensing signal sub-line SL1.

Here, the number of columns of pixel circuits 10 electrically connected to the second sensing signal sub-line SL2 may be an odd number or an even number.

For example, in a case where the number of the columns of pixel circuits 10 electrically connected to the second sensing signal sub-line SL2 is the odd number, the numbers of columns of pixel circuits 10 located on both sides of the first sensing signal sub-line SL1 are different.

For example, the number of the columns of pixel circuits 10 electrically connected to the second sensing signal sub-line SL2 is 3, and then the numbers of columns of pixel circuits located on both sides of the first sensing signal sub-line SL1 may be 1 and 2.

For example, in a case where the number of the columns of pixel circuits 10 electrically connected to the second sensing signal sub-line SL2 is the even number, the numbers of columns of pixel circuits 10 located on both sides of the first sensing signal sub-line SL1 may be the same or different.

For example, in a case where the second sensing signal sub-line SL2 is electrically connected to two columns of pixel circuits 10, the two columns of pixel circuits may be located on both sides of the first sensing signal sub-line SL1.

As another example, in a case where the second sensing signal sub-line SL2 is electrically connected to four columns of pixel circuits 10, one column of pixel circuits in the four columns of pixel circuits 10 may be located on a side of the first sensing signal sub-line SL1, and the remaining three columns of pixel circuits in the four columns of pixel circuits 10 may be located on the other side of the first sensing signal sub-line SL1.

As another example, as shown in FIG. 5, in a case where the second sensing signal sub-line SL2 is electrically connected to four columns of pixel circuits 10, and the second sensing signal sub-line SL2 is arranged symmetrically with respect to the first sensing signal sub-line SL1 electrically connected thereto, two columns of pixel circuits in the four columns of pixel circuits 10 may be located on a side of the first sensing signal sub-line SL1, and the remaining two columns of pixel circuits in the four columns of pixel circuits 10 may be located on the other side of the first sensing signal sub-line SL1.

By adopting the above provision manner, the loads on the left and right sides of the first sensing signal sub-line SL1 may be relatively uniform, so as to avoid a significant loss difference of the electrical signal transmitted by the sensing signal line SL to different columns of pixel circuits 10, thereby improving the accuracy of the electrical signals transmitted by the sensing signal line SL to different columns of pixel circuits 10.

In some examples, sensing circuits 11 of at least two columns of pixel circuits 10 electrically connected to the second sensing signal sub-line SL2 are arranged symmetrically with respect to the first sensing signal sub-line SL1. Of course, "the at least two columns of pixel circuits 10" here may be even columns of pixel circuits, and the numbers of columns of pixel circuits located on both sides of the first sensing signal sub-line SL1 are equal.

For example, due to errors of manufacturing process of the pixel circuit, the above "arranged symmetrically" may not be symmetrical in a strict sense.

For example, sensing circuits 11 of two columns of pixel circuits 10 electrically connected to the second sensing signal sub-line SL2 are arranged symmetrically with respect to the first sensing signal sub-line SL1. That is, firstly, both sides of the first sensing signal sub-line SL1 are each provide with a column of pixel circuits; secondly, a distance between sensing circuits 11 of a column of pixel circuits 10 and the first sensing signal sub-line SL1 is the same or substantially the same as a distance between sensing circuits 11 of the other column of pixel circuits 10 and the first sensing signal sub-line SL1. In addition, the patterns of the sensing circuits 11 of the column of pixel circuits 10 and the patterns of the sensing circuits 11 of the other column of pixel circuits 10 are the same and are arranged symmetrically with respect to the first sensing signal sub-line SL1.

By adopting the above provision manner, the sensing circuits 11 of the pixel circuits 10 may be arranged regularly, which is convenient for the manufacture of the display substrate. Moreover, the transmission distances of the sensing signals provided by the pixel circuits 10 on both sides of the first sensing signal sub-line SL1 are relatively short, the loss of the sensing signal transmitted to the sensing signal line SL is relatively small, and the accuracy of the sensing signal received by the sensing signal line SL is relatively high. As a result, the threshold voltage obtained through calculation and the compensation value of the threshold voltage are relatively accurate, so that the pixel circuit 10 may be rather accurately compensated, and the luminous brightness of the light-emitting device 20 may be close to the preset luminous brightness, thereby improving the display quality of the display substrate 100.

In some embodiments, as shown in FIG. 5, two sensing circuits 11 in the same column in the first row of pixel circuits 10a and the second row of pixel circuits 10b are arranged symmetrically with respect to the second sensing signal sub-line SL2.

For example, due to errors of manufacturing process of the pixel circuit, the above "arranged symmetrically" may not be symmetrical in a strict sense.

For example, the two sensing circuits 11 in the same column in the first row of pixel circuits 10a and the second row of pixel circuits 10b have the same or substantially the same distances to the second sensing signal sub-line SL2. In addition, patterns of the two sensing circuits 11 located in the same column in the first row of pixel circuits 10a and the second row of pixel circuits 10b are the same, and the same patterns are arranged symmetrically with respect to the second sensing signal sub-line SL2.

By adopting the above provision manner, the two sensing circuits 11 in the same column in the first row of pixel circuits 10a and the second row of pixel circuits 10b may receive substantially the same or the same reference voltage signal from the second sensing signal sub-line SL2, thereby improving the accuracy of the reference voltage signal.

In some embodiments, as shown in FIGS. 8 and 11, in the second row of pixel circuits 10b and the third row of pixel circuits 10c, the first electrodes of the second transistors T2 of the two light-emitting control circuits 12 located in the same column are the same electrode, and constitute the first voltage signal terminal ELVDD.

With the above provision manner, the second transistors T2 of the two pixel circuits in the display substrate may share the first electrode, so that the pixel circuit in the display substrate 100 may save an area occupied by half of the first electrode of the second transistor T2, thereby reducing an area occupied by the pixel circuit and an area occupied by the sub-pixel, and increasing the density of the sub-pixels in the display substrate 100, and further improving the display effect of the display substrate 100. In addition, the saved area may also be used for the layout of another structure (e.g., the storage capacitor Cst) in the pixel circuit, so that an area of the another structure (e.g., the storage capacitor Cst) in the pixel circuit may be enlarged, thereby improving the working state of the pixel circuit 10 and improving the display quality of the display substrate.

In some examples, as shown in FIGS. 5 and 11, the display substrate 100 further includes a plurality of first voltage signal lines VL. The first voltage signal line VL includes a first voltage signal sub-line VL1 extending in the second direction Y, and a plurality of second voltage signal sub-lines VL2 each extending in the first direction X and electrically connected to the first voltage signal sub-line VL1.

For example, the connection positions between the plurality of second voltage signal sub-lines VL2 and the first voltage signal sub-line VL1 of the first voltage signal line VL may vary.

For example, an end of each of the plurality of second voltage signal sub-lines VL2 may be used as the connection position, so as to realize the connection with the first voltage signal sub-line VL1.

As another example, another portion, except the end, of each of the plurality of second voltage signal sub-lines VL2 may be used as the connection position, so as to realize the connection with the first voltage signal sub-line VL1.

All the second voltage signal sub-lines VL2 of the first voltage signal line VL and the first voltage signal sub-line VL1 may have the same or different connection positions.

For example, each second voltage signal sub-line VL2 may be arranged symmetrically with respect to the first voltage signal sub-line VL1 electrically connected thereto. In this case, the connection position between each second voltage signal sub-line VL2 and the first voltage signal sub-line VL1 is located at the center of the second voltage signal sub-line VL2.

For example, a second voltage signal sub-line VL2 is located in a second gap region 102, and the second voltage signal sub-line VL2 is electrically connected to the first voltage signal terminals ELVDD of at least two columns of pixel circuits 10.

For example, a second voltage signal sub-line VL2 may be electrically connected to first voltage signal terminal ELVDD of two, three, four or eight columns of pixel circuits 10.

By adopting the above provision manner, it is convenient to realize the nearby connection between the second voltage signal sub-line VL2 and the first voltage signal terminal ELVDD, thereby preventing the second voltage signal sub-line VL2 from being electrically connected with the first voltage signal terminal ELVDD by going across a plurality of other signal lines, and further avoiding existence of parasitic capacitances between the second voltage signal sub-line VL2 and the above other signal lines. Thus, the electrical signal transmitted on the second voltage signal sub-line VL2 may be prevented from being interfered by the electrical signals on the above other signal lines, and the accuracy of the electrical signal on the second voltage signal sub-line VL2 may be improved.

Moreover, the number of the second voltage signal sub-lines VL2 may be reduced. A relatively small number of first voltage signal sub-lines VL1 is used to achieve the electrical connection with multiple columns of pixel circuits 10, so that the number of the first voltage signal lines VL may be reduced, thereby reducing the space or area occupied by first voltage signal lines VL in the display substrate 100, and providing a larger space for the layout of other signal lines or the storage capacitor Cst in the pixel circuit 10.

Therefore, an area of the electrode plate of the storage capacitor Cst in the pixel circuit may be enlarged, and the capacitance of the storage capacitor in the pixel circuit 10 may increase, thereby avoiding electricity leakage caused by insufficient capacitance of the storage capacitor, alleviating the flicker phenomenon of the display substrate 100, and improving the display quality of the display substrate 100.

In addition, the above provision manner reduces the number of the signal lines in the display substrate 100, so that short circuit or open circuit of the signal lines due to excessive signal lines may be alleviated, thereby improving the yield of the signal lines and improving the yield of the display substrate 10.

For example, the relative position between the at least two columns of pixel circuits 10 electrically connected to the second voltage signal sub-line VL2 and the first voltage signal sub-line VL1 electrically connected to the second voltage signal sub-line VL2 may vary, which is not limited in the present disclosure and may be set according to actual needs.

In some examples, as shown in FIGS. 5 and 11, the at least two columns of pixel circuits 10 are located on opposite sides of the first voltage signal sub-line VL1.

Here, the number of columns of pixel circuits 10 electrically connected to the second voltage signal sub-line VL2 may be an odd number or an even number.

For example, in a case where the number of the columns of pixel circuits 10 electrically connected to the second voltage signal sub-line VL2 is the odd number, the numbers of columns of pixel circuits 10 on both sides of the first voltage signal sub-line VL1 are different.

For example, the number of the columns of pixel circuits 10 electrically connected to the second voltage signal sub-line VL2 is 3, and then the numbers of columns of pixel circuits located on both sides of the first voltage signal sub-line VL1 may be 1 and 2.

For example, in a case where the number of the columns of pixel circuits 10 electrically connected to the second voltage signal sub-line VL2 is the even number, the numbers of columns of pixel circuits 10 located on both sides of the first voltage signal sub-line VL1 may be the same or different.

For example, in a case where the second voltage signal sub-line VL2 may be electrically connected to first voltage signal terminals ELVDD of two columns of pixel circuits 10, the two columns of pixel circuits 10 may be located on both sides of the first voltage signal sub-line VL1.

As another example, in a case where the second voltage signal sub-line VL2 may be electrically connected to first voltage signal terminals ELVDD of four columns of pixel circuits 10, one column of pixel circuits in the four columns of pixel circuits 10 may be located on a side of the first voltage signal sub-line VL1, and the remaining three columns of pixel circuits in the four columns of pixel circuits 10 may be located on the other side of the first voltage signal sub-line VL1.

As another example, as shown in FIG. 5, in a case where the second voltage signal sub-line VL2 may be electrically connected to first voltage signal terminals ELVDD of four columns of pixel circuits 10, and the second voltage signal sub-line VL2 is arranged symmetrically with respect to the first voltage signal sub-lines VL1, two columns of pixel circuits in the four columns of pixel circuits 10 may be located on a side of the first voltage signal sub-line VL1, and the remaining two columns of pixel circuits in the four columns of pixel circuits 10 may be located on the other side of the first voltage signal sub-line VL1.

By adopting the above provision manner, the loads on the left and right sides of the first voltage signal sub-line VL1 can be relatively uniform, so as to avoid a significant loss difference of the first voltage signal transmitted by the first voltage signal line VL to different columns of pixel circuits 10, thereby improving the accuracy of the first voltage signal transmitted by the first voltage signal line VL.

In some examples, as shown in FIG. 5, light-emitting control circuits 12 of at least two columns of pixel circuits 10 electrically connected to the second voltage signal sub-line VL2 are arranged symmetrically with respect to the first voltage signal sub-line VL1. Of course, "the at least two columns of pixel circuits 10" here may be even columns of pixel circuits, and the numbers of columns of pixel circuits located on both sides of the first voltage signal sub-line VL1 are equal.

For example, due to errors of manufacturing process of the pixel circuit, the above "arranged symmetrically" may not be symmetrical in a strict sense.

For example, light-emitting control circuits 12 of two column pixel circuits 10 electrically connected to the second voltage signal sub-line VL2 are arranged symmetrically with respect to the first voltage signal sub-line VL1. That is, firstly, both sides of the first voltage signal sub-line VL1 are each provide with a column of pixel circuits; secondly, a distance between light-emitting control circuits 12 of a column of pixel circuits 10 and the first voltage signal sub-line VL1 is the same or substantially the same as a distance between light-emitting control circuits 12 of the other column of pixel circuits 10 and the first voltage signal sub-line VL1. Moreover, the patterns of the light-emitting control circuits 12 of the column of pixel circuits 10 and the patterns of the light-emitting control circuits 12 of the other column of pixel circuits 10 are the same and are arranged symmetrically with respect to the first voltage signal sub-line VL1.

By adopting the above provision manner, the light-emitting control circuits 12 of the pixel circuits 10 may be arranged regularly, which is convenient for the manufacture of the display substrate. Moreover, the transmission distances of the first voltage signals received by the pixel circuits 10 on both sides of the first voltage signal sub-line VL1 are relatively short, the loss of the first voltage signal is relatively small, and the accuracy of the first voltage signal received by the light-emitting control circuit 12 is relatively high. As a result, the driving signal transmitted from the pixel circuit 10 to the light-emitting device is relatively accurate, so that the luminous brightness of the light-emitting device may be close to the preset luminous brightness, thereby improving the display quality of the display substrate 100.

In some embodiments, as shown in FIG. 5, two light-emitting control circuits 12 in the same column in the second row of pixel circuits 10b and the third row of pixel circuits 10c are arranged symmetrically with respect to the second voltage signal sub-line VL2.

For example, due to errors of manufacturing process of the pixel circuit, the above "arranged symmetrically" may not be symmetrical in a strict sense.

For example, the two light-emitting control circuits 12 in the same column in the second row of pixel circuits 10b and the third row of pixel circuits 10c have the same or substantially the same distances to the second voltage signal sub-line VL2. In addition, patterns of the two light-emitting control circuits 12 located in the same column in the second row of pixel circuits 10b and the third row of pixel circuits 10c are the same, and the same patterns are arranged symmetrically with respect to the second voltage signal sub-line VL2.

By adopting the above provision manner, the two light-emitting control circuits 12 in the same column in the second row of pixel circuits 10b and the third row of pixel circuits 10c may receive substantially the same or the same first voltage signal from the second voltage signal sub-line VL2, thereby improving the accuracy of the first voltage signal.

For example, the arrangement of the first sensing signal sub-line SL1, the second sensing signal sub-line SL2, the first voltage signal sub-line VL1 and the second voltage signal sub-line VL2 may vary, and may be set according to actual needs, which is not limited in the present disclosure.

In some embodiments, as shown in FIGS. 5 and 11, the plurality of first sensing signal sub-lines SL1 and the plurality of first voltage signal sub-lines VL1 extend in the second direction Y.

For example, the first sensing signal sub-lines SL1 and the first voltage signal sub-lines VL1 are arranged alternately, and the first sensing signal sub-line SL1 and the first voltage signal sub-line VL1 that are adjacent are provided with at least one column of pixel circuits 10 therebetween.

For example, one column of pixel circuits 10 is disposed between the adjacent first sensing signal sub-lines SL1 and first voltage signal sub-lines VL1. As another example, two, three or four columns of pixel circuits 10 are disposed between the adjacent first sensing signal sub-lines SL1 and first voltage signal sub-lines VL1.

For example, the arrangement of the first sensing signal sub-lines SL1 and the first voltage signal sub-lines VL1 may be as: the first sensing signal sub-line SL1, the first voltage signal sub-line VL1, the first sensing signal sub-line SL1, the first voltage signal sub-line VL1 . . . .

By adopting the above provision manner, the distance between the adjacent second sensing signal sub-line SL2 and the second voltage signal sub-line VL2 may increase, so as to avoid existence of parasitic capacitance between the second sensing signal sub-line SL2 and the second voltage signal sub-line VL2, thereby avoiding mutual interference between the reference voltage signal and the first voltage signal or between the sensing signal and the first voltage signal, and avoiding the delay and/or loss of the above electrical signals. Therefore, the accuracy of the electrical signals received by the sensing circuit 11 and the light-emitting control circuit 12 may be improved, the accuracy of the driving signal transmitted from the pixel circuit 10 to the light-emitting device 20 may be improved, and the display quality of the display substrate 100 may be improved.

In some embodiments, as shown in FIG. 11, in the pixel circuit, in the second direction Y, the first transistor T1 is located on a side of the storage capacitor Cst, and the second transistor T2, the third transistor T3, and the fourth transistor T4 are all located on another side of the storage capacitor Cst. The fourth transistor T4 is located between the storage capacitor Cst and the second transistor T2.

In some examples, in the first direction X, the third transistor T3 is located on a side of the fourth transistor T4, and in the second direction Y, the third transistor T3 is located between the fourth transistor T4 and the second transistor T2.

By adopting the above provision manner, the first electrode of the first transistor T1 in the first row of pixel circuits 10a may be provided proximate to the first electrode of the first transistor T1 in the second row of pixel circuits 10b, so that the first transistor T1 in the first row of pixel circuits 10a and the first transistor T1 in the second row of pixel circuits 10b share the sensing signal terminal Sense and share the first electrode. Therefore, the pixel circuit 10 may save an area occupied by half of the first electrode of the transistor, thereby reducing an area occupied by the sub-pixel and increasing the PPI of the display substrate, and further improving the display effect of the display substrate 100.

Moreover, the first electrode of the second transistor T2 in the second row of pixel circuits 10b may be provided proximate to the first electrode of the second transistor T2 in the third row of pixel circuits 10c, so that the second transistor T2 in the second row of pixel circuits 10b and the second transistor T2 in the third row of pixel circuits 10c share the first voltage signal terminal ELVDD and share the first electrode. Therefore, the pixel circuit 10 may save an area occupied by half of the first electrode of the second transistor, thereby reducing an area occupied by the sub-pixel and increasing the PPI of the display substrate, and further improving the display effect of the display substrate 100.

In addition, the saved areas of halves of the first electrodes of the two transistors may be used to improve the design of the storage capacitor Cst in the pixel circuit 10, and increase the area of the storage capacitor Cst in the pixel circuit 10. For example, the area of the storage capacitor reaches (32 μm×34 μm), which is equal to 1088 μm². It can be seen that, compared with the above another implementation, the area of the storage capacitor in the embodiments of the present disclosure has more than doubled, so that the capacitance of the storage capacitor Cst may increase, thereby avoiding electricity leakage of the pixel circuit 10 caused by insufficient capacitance of the storage capacitor Cst, alleviating the flicker phenomenon of the display substrate 100, and improving the display quality of the display substrate 100.

In some embodiments, as shown in FIGS. 12 to 17b, a pixel circuit layer in the display substrate 100 includes a transfer layer CNT, a semiconductor layer ACT, a gate conductive layer Gate, and a source-drain conductive layer SD that are disposed sequentially. The pixel circuit 10 is located in the pixel circuit layer of the display substrate 100.

In some examples, the pixel circuit layer in the display substrate 100 further includes a first insulating layer GI1 disposed between the transfer layer CNT and the semiconductor layer ACT, and a second insulating layer GI2 disposed between the gate conductive layer Gate and the source-drain conductive layer SD.

Figure 12:
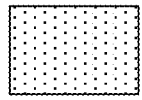
FIG. 12 is a top view of some other layers in a display substrate, in accordance with some embodiments of the present disclosure.
Figure 12:
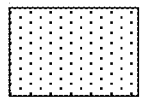
Figure 12:
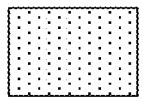
Figure 12:
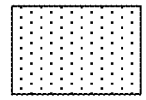
Figure 12:
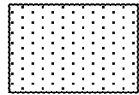
Figure 12:
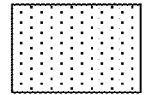
Figure 12:
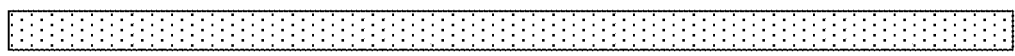
Figure 12:
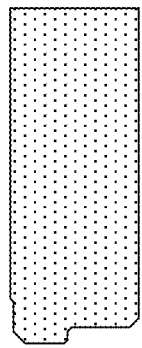
Figure 12:
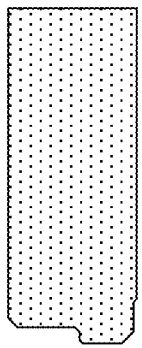
Figure 12:
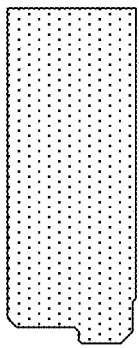
Figure 12:
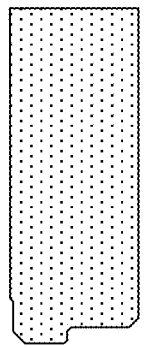
Figure 12:
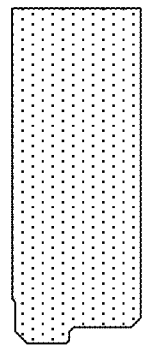
Figure 12:
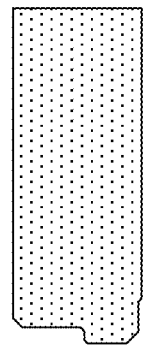
Figure 12:
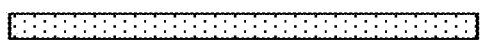
Figure 12:
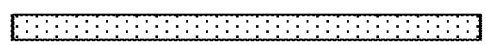
Figure 12:
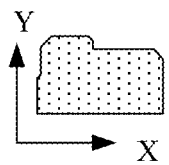
Figure 12:
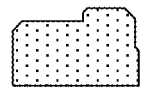
Figure 12:
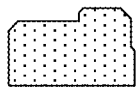
Figure 12:
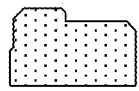
Figure 12:
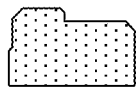
Figure 12:
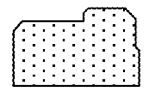
Figure 13A:
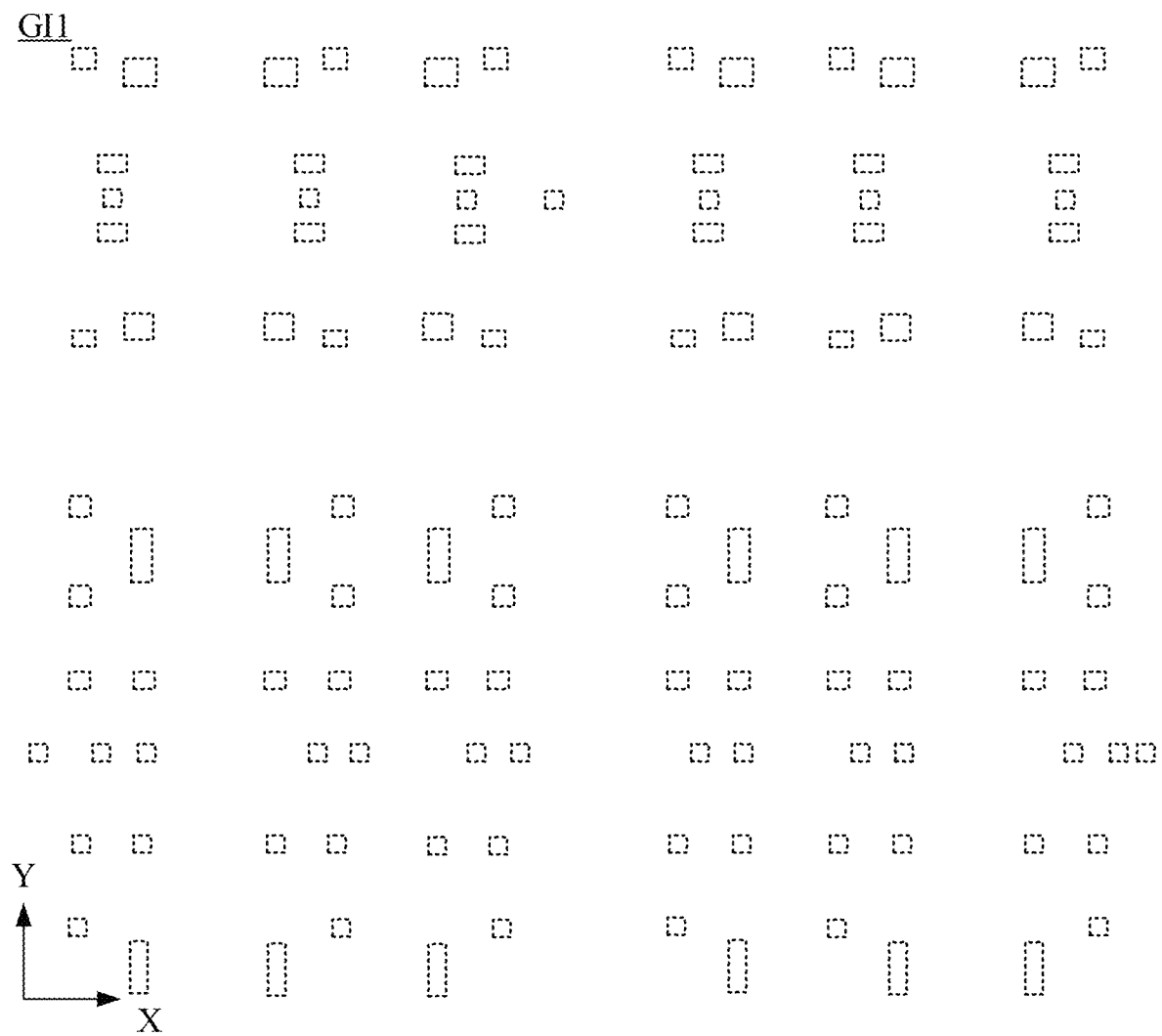
FIG. 13a is a top view of yet other layers in a display substrate, in accordance with some embodiments of the present disclosure.
Figure 13B:
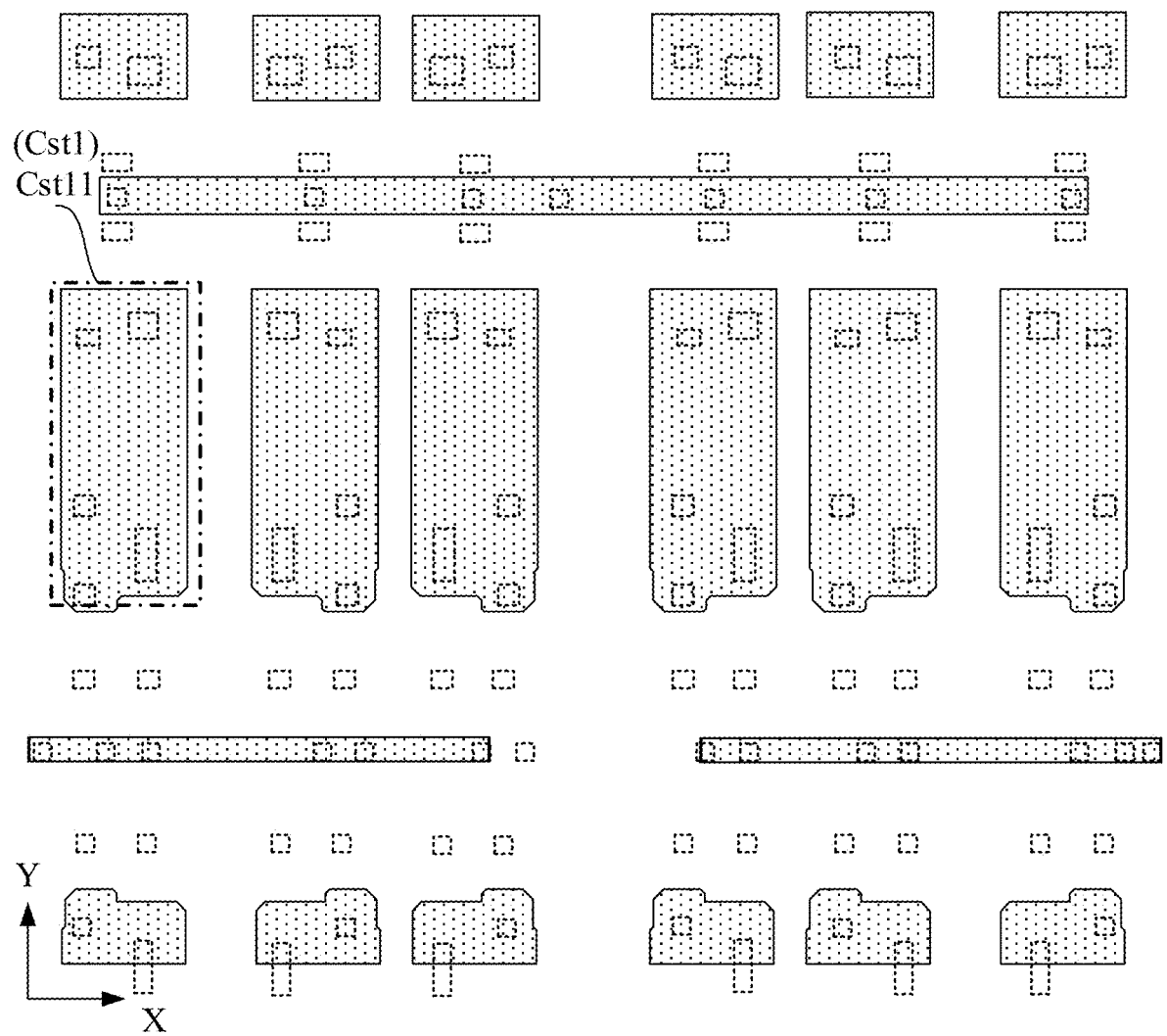
FIG. 13b is a top view of yet other layers in a display substrate, in accordance with some embodiments of the present disclosure.
Figure 14A:
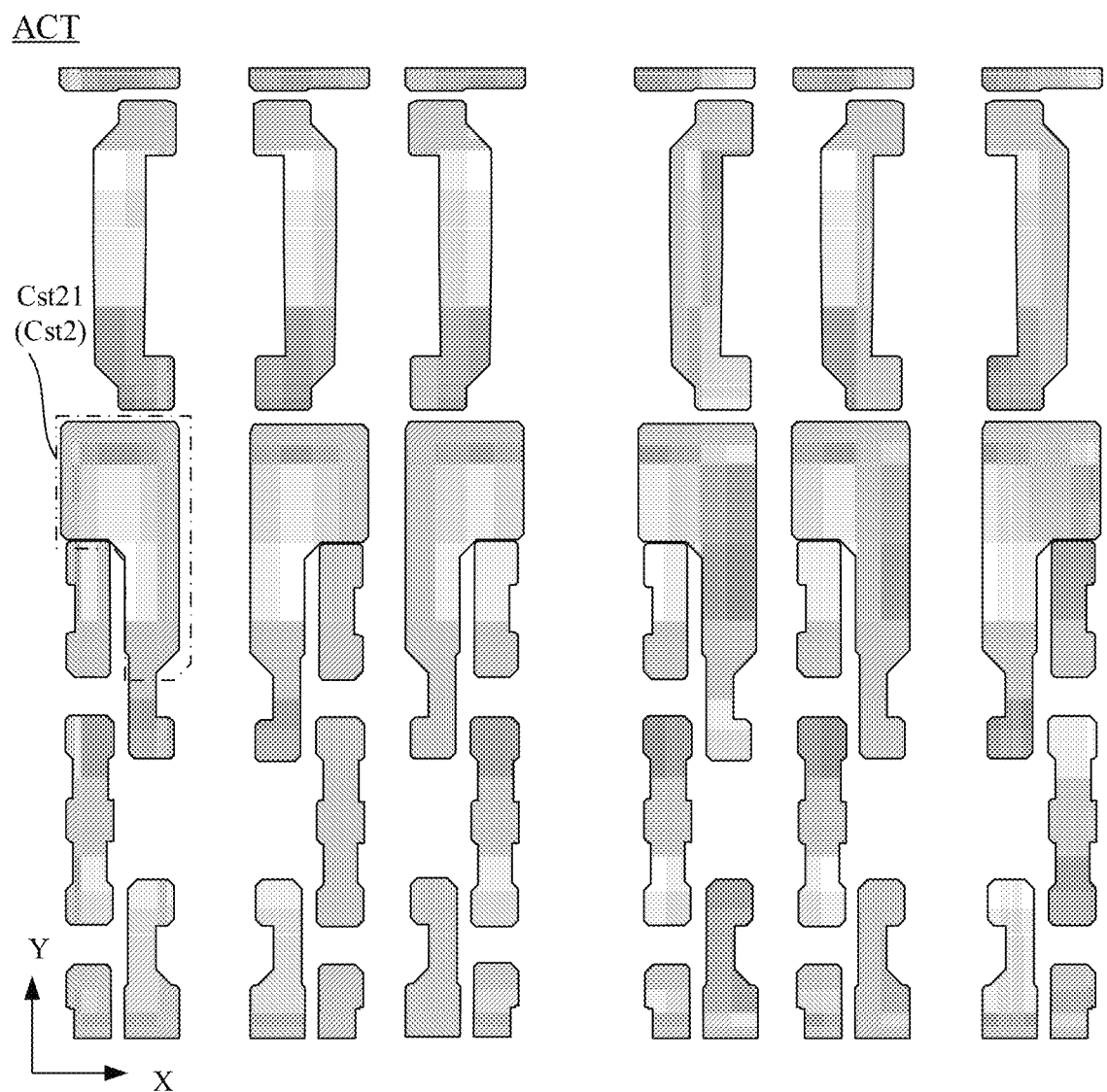
FIG. 14a is a top view of yet other layers in a display substrate, in accordance with some embodiments of the present disclosure.
Figure 14B:
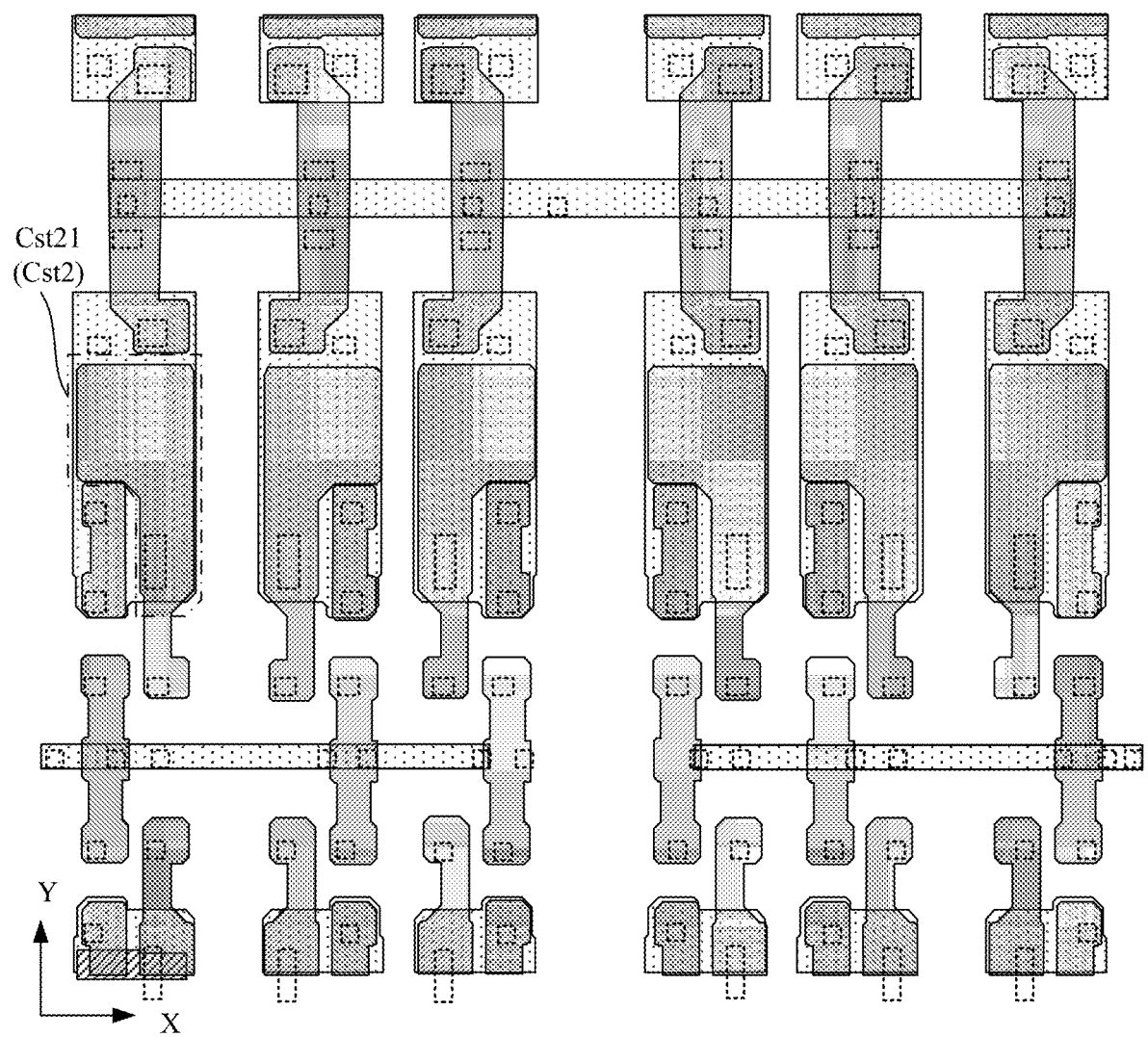
FIG. 14b is a top view of yet other layers in a display substrate, in accordance with some embodiments of the present disclosure.

FIG. 12 shows a top view of the structure of the transfer layer CNT. FIG. 13a shows a top view of the structure of the first insulating layer GI1. FIG. 13b shows a top view of the structure of the transfer layer CNT and the first insulating layer GI1 that are arranged in sequence. FIG. 14a shows a top view of the structure of the semiconductor layer ACT. FIG. 14b shows a top view of the structure of the transfer layer CNT, the first insulating layer GI1, and the semiconductor layer ACT that are arranged in sequence.

Figure 15A:
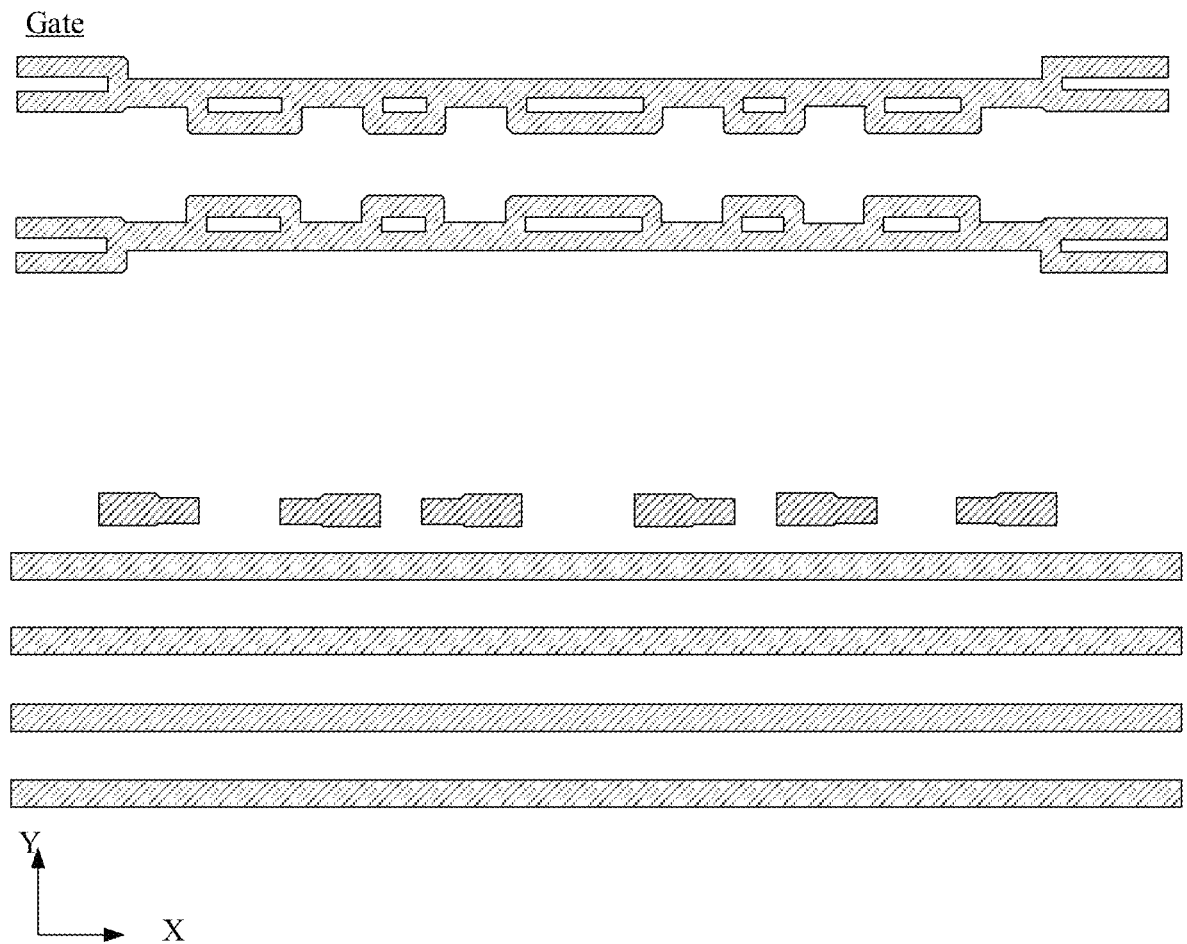
FIG. 15a is a top view of yet other layers in a display substrate, in accordance with some embodiments of the present disclosure.
Figure 15B:
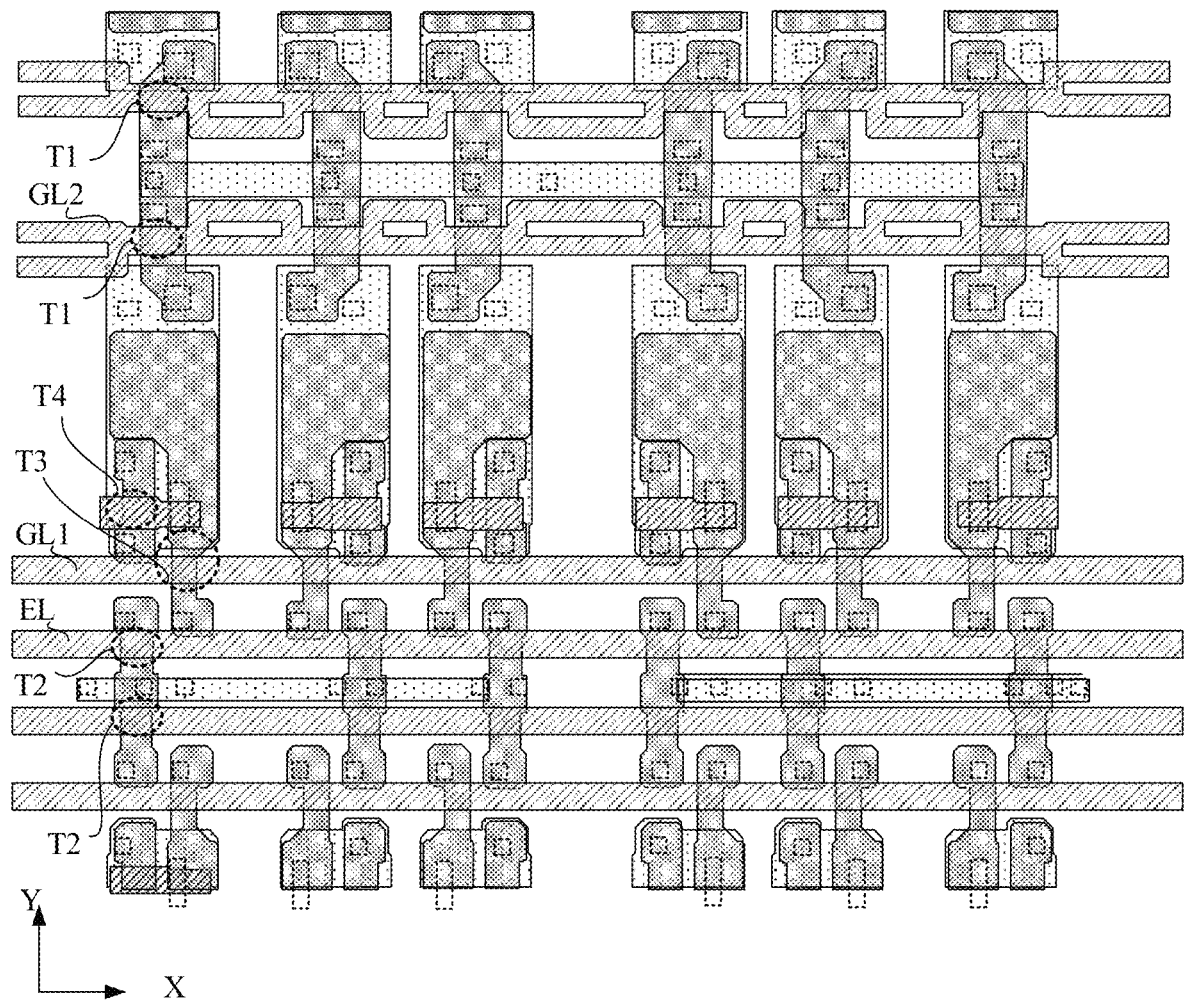
FIG. 15b is a top view of yet other layers in a display substrate, in accordance with some embodiments of the present disclosure.
Figure 16A:
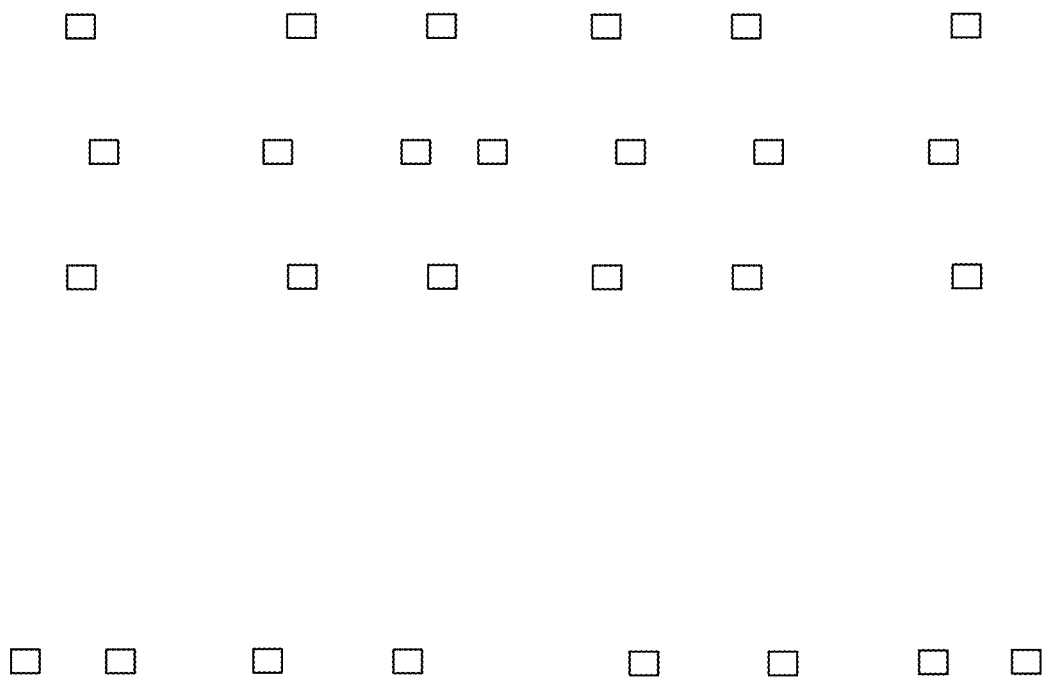
FIG. 16a is a top view of yet other layers in a display substrate, in accordance with some embodiments of the present disclosure.
Figure 16B:
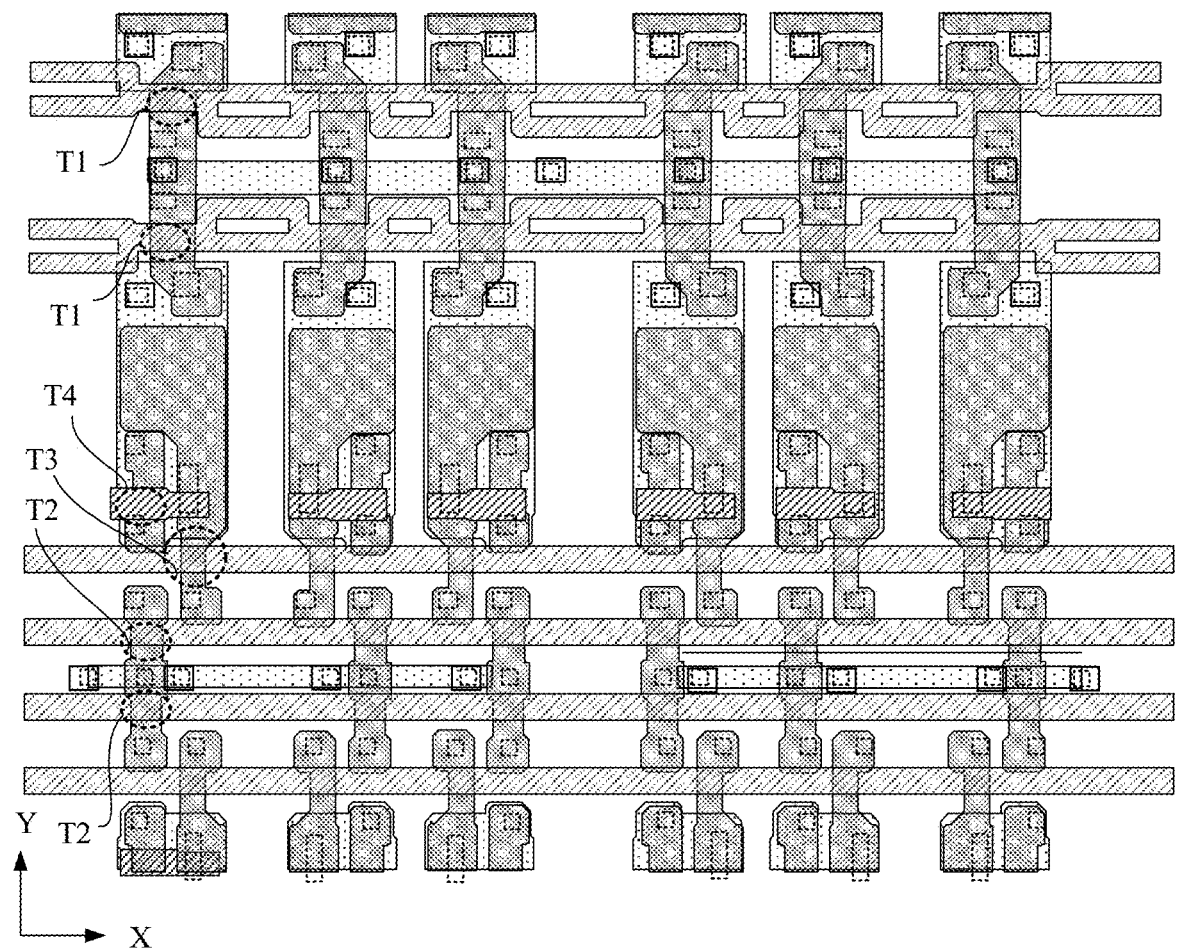
FIG. 16b is a top view of yet other layers in a display substrate, in accordance with some embodiments of the present disclosure.
Figure 17A:
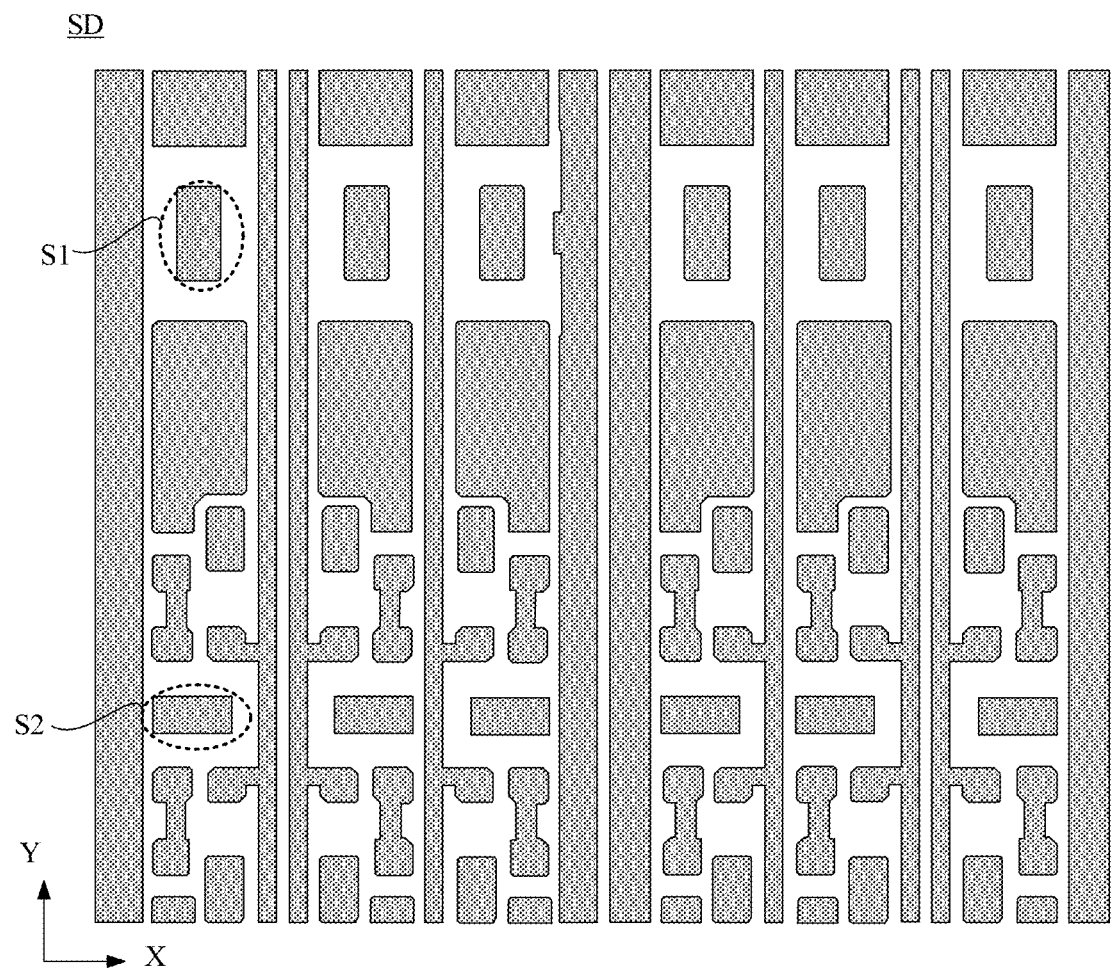
FIG. 17a is a top view of yet other layers in a display substrate, in accordance with some embodiments of the present disclosure.
Figure 17B:
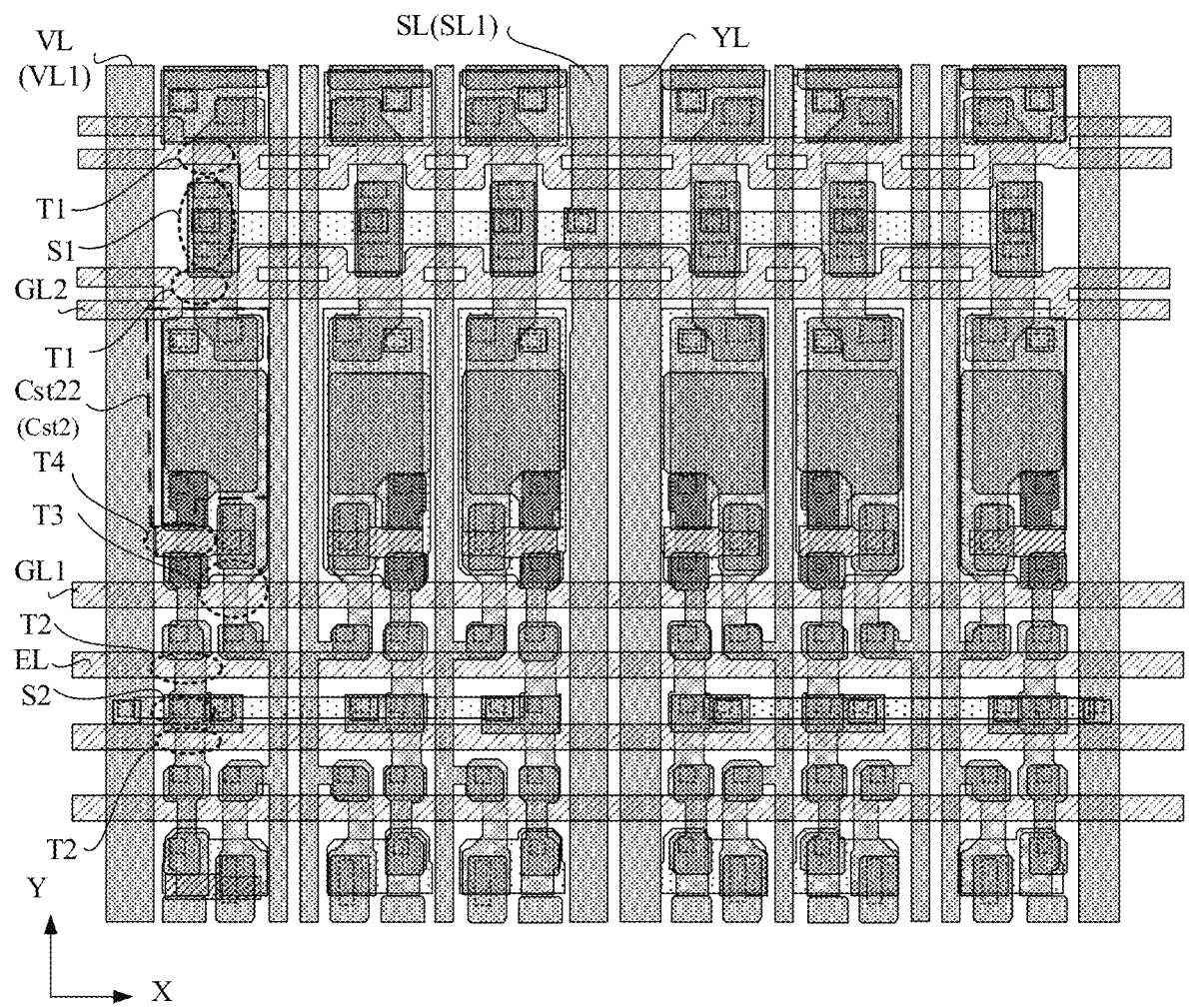
FIG. 17b is a top view of yet other layers in a display substrate, in accordance with some embodiments of the present disclosure.

FIG. 15a shows a top view of the structure of the gate conductive layer Gate. FIG. 15b shows a top view of the structure of the transfer layer CNT, the first insulating layer GI1, the semiconductor layer ACT, and the gate conductive layer Gate that are arranged in sequence. FIG. 16a shows a top view of the structure of the second insulating layer GI2. FIG. 16b shows a top view of the structure of the transfer layer CNT, the first insulating layer GI1, the semiconductor layer ACT, the gate conductive layer Gate, and the second insulating layer GI2 that are arranged in sequence. FIG. 17a shows a top view of the structure of the source-drain conductive layer SD. FIG. 17b shows a top view of the structure of the transfer layer CNT, the first insulating layer GI1, the semiconductor layer ACT, the gate conductive layer Gate, the second insulating layer GI2, and the source-drain conductive layer SD that are arranged in sequence.

For example, for the convenience of understanding, only positions of via holes in the first insulating layer GI1 and the second insulating layer GI2 are shown in FIGS. 12 to 17b.

For example, an interlayer dielectric layer is further provided between the semiconductor layer ACT and the gate conductive layer Gate for insulating the electrical connection between the semiconductor layer ACT and the gate conductive layer Gate.

For example, materials of the first insulating layer GI1, the second insulating layer GI2, and the interlayer dielectric layer may be insulating materials, such as silicon oxide, silicon nitride, silicon oxynitride, and the like.

A material of the semiconductor layer ACT includes amorphous silicon, monocrystalline silicon, polycrystalline silicon, or a meta-oxide-semiconductor material.

For example, materials of the gate conductive layer Gate and the source-drain conductive layer SD are both conductive materials. For example, the materials of the gate conductive layer Gate and the source-drain conductive layer SD may be the same; alternatively, the materials of the gate conductive layer Gate and the source-drain conductive layer SD may be different.

For example, the materials of the gate conductive layer Gate and the source-drain conductive layer SD may be metal materials, such as Al (aluminum), Ag (silver), Cu (copper), Cr (chromium) and the like.

It will be noted that an orthographic projection of the semiconductor layer ACT on a substrate overlaps with an orthographic projection of the gate conductive layer Gate on the substrate. After the gate conductive layer Gate is formed on a side of the semiconductor layer ACT away from the substrate, doping treatment may be performed on the semiconductor layer ACT by using the gate conductive layer Gate as a mask, so that portions of the semiconductor layer ACT covered by the gate conductive layer Gate constitute the active patterns of all the transistors, and portions of the semiconductor layer ACT not covered by the gate conductive layer Gate constitute conductors, and the conductors may be portions of first electrodes or a portions of second electrodes of transistors. The overlapping portions of the gate conductive layer Gate and the semiconductor layer ACT constitute gate patterns (i.e., gates) of all the transistors.

In some examples, as shown in FIGS. 17a and 17b, the first electrode of the first transistor T1 includes a first source pattern S1 located in the source-drain conductive layer SD. In the first row of pixel circuits 10a and the second row of pixel circuits 10b, the first source patterns S1 of the two first transistors T1 located in the same column have a one-piece structure.

It can be understood that the first electrode of the first transistor T1 includes two portions, one is the above first source pattern S1, and the other is a portion of the semiconductor layer ACT not covered by the gate conductive layer Gate.

For example, "a one-piece structure" means that two connected patterns are arranged in the same layer, and the two patterns are continuous and not separated. In the first row of pixel circuits 10a and the second row of pixel circuits 10b, the two first transistors T1 located in the same column may be electrically connected by the first source pattern S1, and may be electrically connected to the second sensing signal sub-lines by the first source pattern S1.

With the above provision manner, firstly, the structures of the first transistors and the display substrate and manufacturing process thereof may be simplified; secondly, the two pixel circuits 10 in the display substrate 100 may share the first electrode of the first transistor T1, so that the pixel circuit 10 in the display substrate 100 may save an area occupied by half of the first electrode of the first transistor T1, and further reduce an area occupied by the pixel circuit, thereby increasing the density of sub-pixels in the display substrate 100, and improving the display effect of the display substrate 100. In addition, the saved area occupied by half of the first electrode of the first transistor T1 may also be used for the layout of the storage capacitor Cst in the pixel circuit 10, thereby increasing the area of the storage capacitor Cst in the pixel circuit 10, and improving the storage capacity of the storage capacitor Cst. As a result, it may be possible to prevent electricity leakage of the pixel circuit caused by insufficient storage capacity of the storage capacitor Cst from affecting the luminous brightness of the light-emitting device, thereby improving the display quality of the display substrate 100.

In some examples, as shown in FIGS. 17a and 17b, the first electrode of the second transistor T2 includes a second source pattern S2 located in the source-drain conductive layer SD. In the second row of pixel circuits 10b and the third row of pixel circuit 10c, the second source patterns S2 of the two second transistors T2 in the same column have a one-piece structure.

For example, "a one-piece structure" means that two connected patterns are arranged in the same layer, and the two patterns are continuous and not separated.

For example, the first electrode of the second transistor T2 includes two portions, one is the above second source pattern S2, and the other is a portion of the semiconductor layer ACT not covered by the gate conductive layer Gate.

With the above provision manner, firstly, the two pixel circuits 10 in the display substrate 100 may share the first electrode of the second transistor T2, so that the pixel circuit 10 in the display substrate 100 may save an area occupied by half of the first electrode of the second transistor T2, and further reduce an area occupied by the pixel circuit, thereby increasing the density of sub-pixels in the display substrate 100, and improving the display effect of the display substrate 100. In addition, the saved area occupied by half of the first electrode of the second transistor T2 may also be used for the layout of the storage capacitor Cst in the pixel circuit 10, thereby increasing the area of the storage capacitor Cst in the pixel circuit 10, and improving the storage capacity of the storage capacitor Cst. As a result, it may be possible to prevent electricity leakage of the pixel circuit caused by insufficient storage capacity of the storage capacitor Cst from affecting the luminous brightness of the light-emitting device, thereby improving the display quality of the display substrate 100.

In some examples, as shown in FIG. 3, the first electrode Cst1 of the storage capacitor Cst includes a first electrode plate Cst11 (as shown in FIG. 13b) located in the transfer layer CNT, and the second electrode Cst2 of the storage capacitor Cst includes a second electrode plate Cst21 located in the semiconductor layer ACT (as shown in FIGS. 14a and 14b) and a third electrode plate Cst22 located in the source-drain conductive layer SD (as shown in FIG. 17b), and the second electrode plate Cst21 and the third electrode plate Cst22 are electrically connected.

For example, the second electrode plate Cst21 may be electrically connected to the third electrode plate Cst22 through a via hole.

By adopting the above provision manner, the first electrode plate Cst11 and the second electrode plate Cst21 constitute a capacitor, and the second electrode plate Cst21 and the third electrode plate Cst22 constitute another capacitor. These two capacitors share an electrode plate, which is equivalent to connecting two capacitors in parallel. That is, the storage capacitor Cst is composed of two capacitors connected in parallel. Thus, the capacitance of the storage capacitor Cst may increase, the storage capacity of the storage capacitor Cst may be improved, and the electricity leakage of the pixel circuit caused by insufficient storage capacity of the storage capacitor Cst may be alleviated or prevented from affecting the luminous brightness of the light-emitting device, thereby improving the display quality of the display substrate 100.

In some examples, as shown in FIG. 15b, the first scan signal lines GL1, the second scan signal lines GL2, and the enable signal lines EL are located in the gate conductive layer Gate. As shown in FIG. 11, the first sensing signal sub-lines SL1 and the first voltage signal sub-lines VL1 are located in the source-drain conductive layer SD. The second sensing signal sub-lines SL2 and the second voltage signal sub-lines VL2 are located in the transfer layer CNT. The first sensing signal sub-line SL1 is connected to the second sensing signal sub-line SL2 through a via hole, and the first voltage signal sub-line VL1 is connected to the second voltage signal sub-line VL2 through a via hole.

In some embodiments, as shown in FIG. 11, the display substrate 100 further includes a second electrode auxiliary line YL extending in the second direction Y.

In some examples, an end of the light-emitting device 20 is electrically connected to the third node N3 of the pixel circuit 10, and another end of the light-emitting device 20 is electrically connected to the second electrode auxiliary line YL.

For example, the second electrode auxiliary line YL is located in the source-drain conductive layer SD. The second electrode auxiliary line YL is electrically connected to the second electrode 23 of the light-emitting device 20 through a via hole.

With the above provision manner, the second electrode auxiliary line YL may be connected in parallel with the second electrode. The second electrode is commonly a whole layer of electrode, so that the resistance of the second electrode layer may be reduced, thereby avoiding inconsistent common voltage signals transmitted by portions of the second electrode corresponding to different pixel circuits caused by excessively high resistance of the second electrode. Thus, the abnormal luminance of the light-emitting devices connected to the different pixel circuits may be avoided, and the display effect of the display substrate may further be improved.

In some embodiments, as shown in FIGS. 18a to 20b, the display substrate 100 includes a passivation layer PVX, a planarization layer PLN, and a first electrode layer AND that are arranged sequentially on a side of the source-drain conductive layer SD away from the second insulating layer GI2.

Figure 18A:
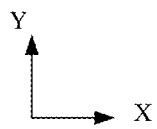
FIG. 18a is a top view of yet other layers in a display substrate, in accordance with some embodiments of the present disclosure.
Figure 18B:
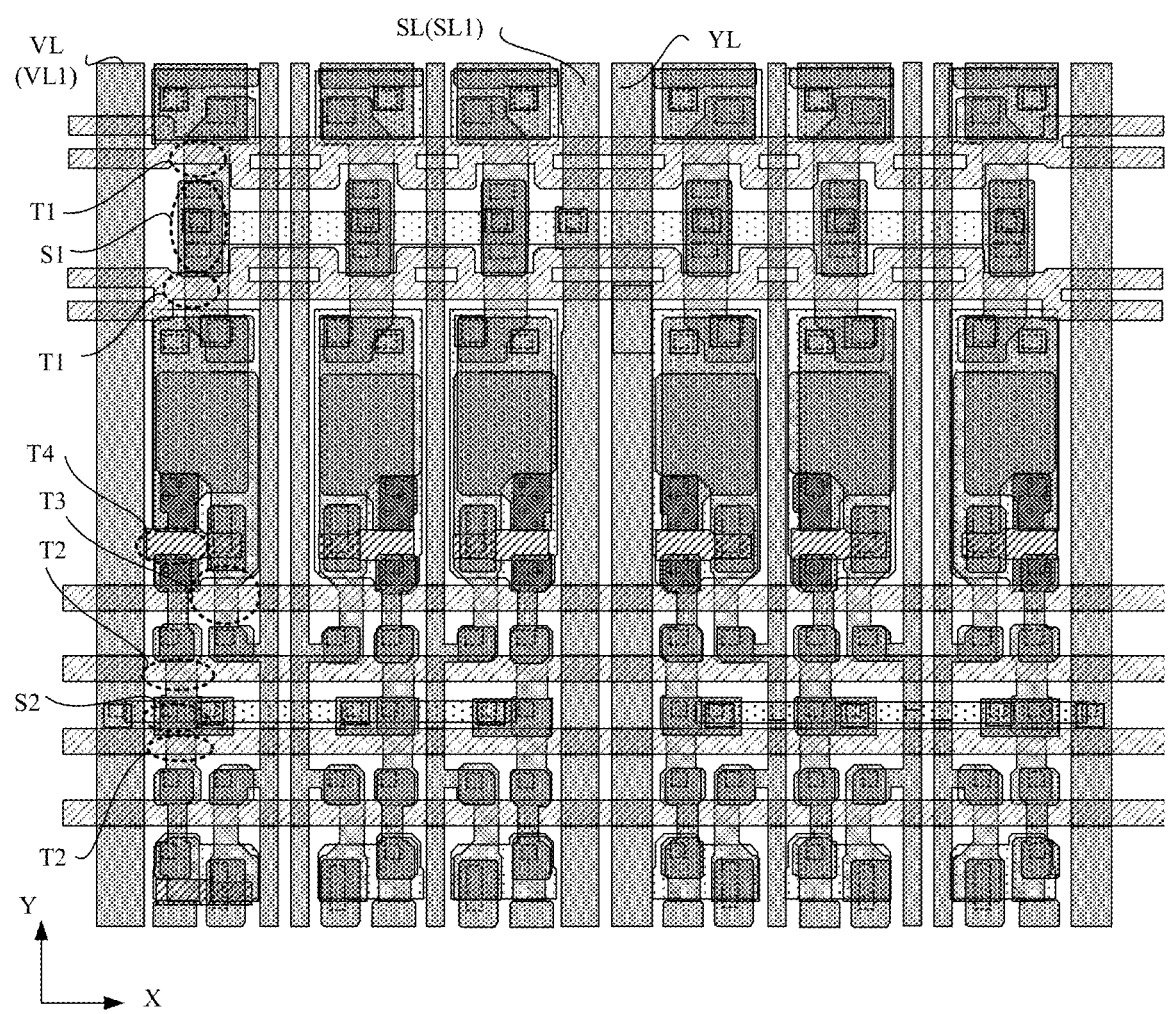
FIG. 18b is a top view of yet other layers in a display substrate, in accordance with some embodiments of the present disclosure.
Figure 19A:
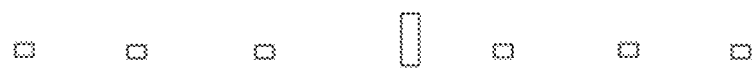
FIG. 19a is a top view of yet other layers in a display substrate, in accordance with some embodiments of the present disclosure.
Figure 19A:
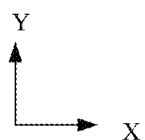
Figure 19B:
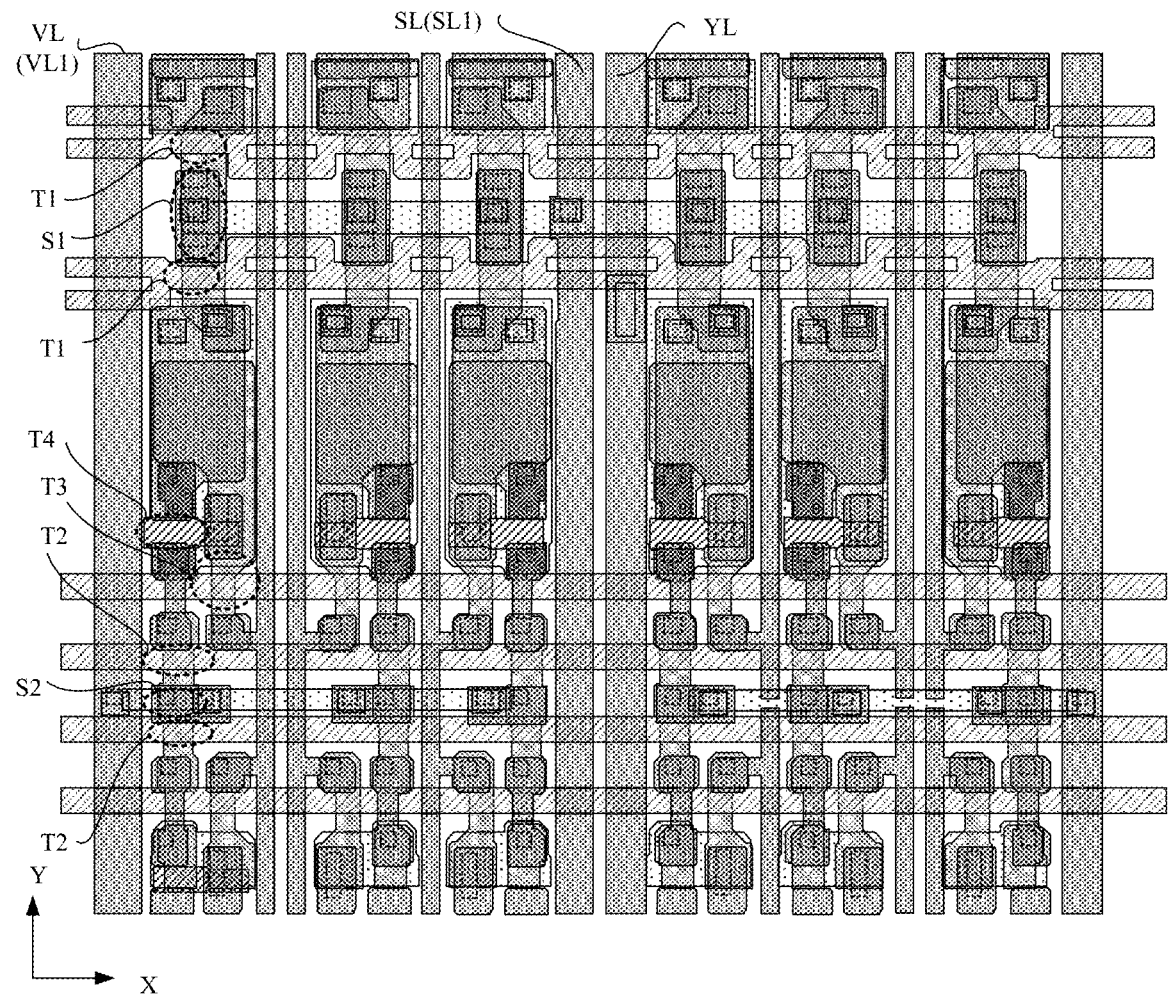
FIG. 19b is a top view of yet other layers in a display substrate, in accordance with some embodiments of the present disclosure.
Figure 20A:
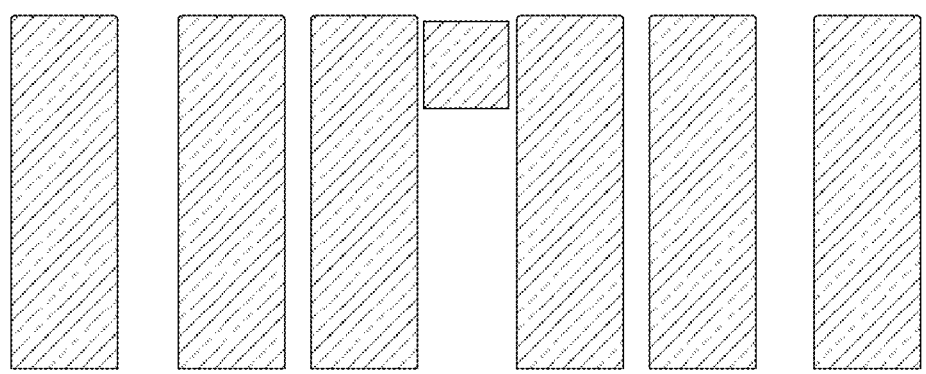
FIG. 20a is a top view of yet other layers in a display substrate, in accordance with some embodiments of the present disclosure.
Figure 20A:
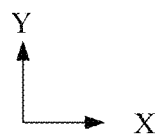
Figure 20B:
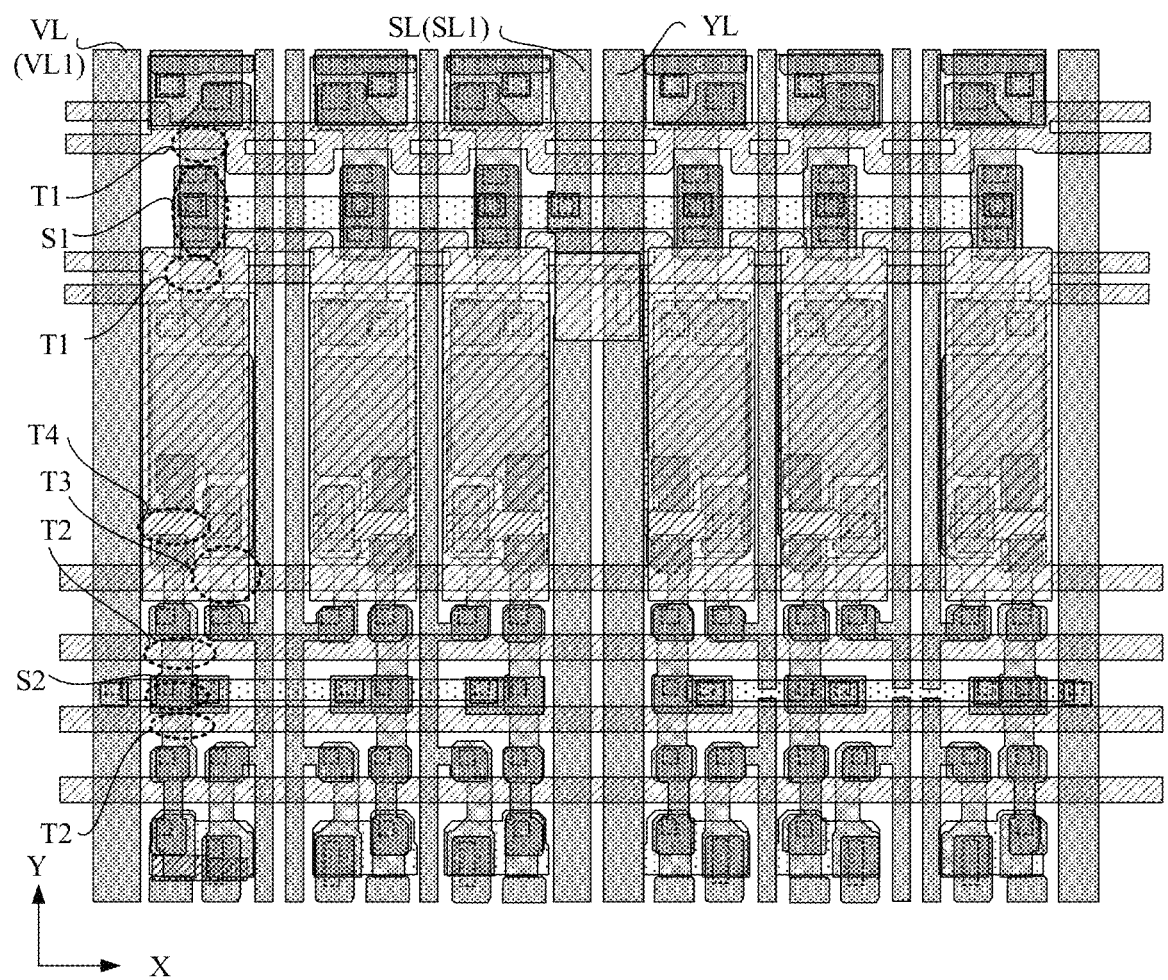
FIG. 20b is a top view of yet other layers in a display substrate, in accordance with some embodiments of the present disclosure.

FIG. 18a shows a top view of the structure of the passivation layer PVX. FIG. 18b shows a top view of the structure of the transfer layer CNT, the first insulating layer GI1, the semiconductor layer ACT, the gate conductive layer Gate, the second insulating layer GI2, the source-drain conductive layer SD, and the passivation layer PVX that are arranged in sequence. FIG. 19a shows a top view of the structure of the planarization layer PLN. FIG. 19b shows a top view of the structure of the transfer layer CNT, the first insulating layer GI1, the semiconductor layer ACT, the gate conductive layer Gate, the second insulating layer GI2, the source-drain conductive layer SD, the passivation layer PVX, and the planarization layer PLN that are arranged in sequence. FIG. 20a shows a top view of the structure of the first electrode layer AND. FIG. 20b shows a top view of the structure of the transfer layer CNT, the first insulating layer GI1, the semiconductor layer ACT, the gate conductive layer Gate, the second insulating layer GI2, the source-drain conductive layer SD, the passivation layer PVX, the planarization layer PLN, and the first electrode layer AND that are arranged in sequence.

For example, for the convenience of understanding, only positions of via holes in the passivation layer PVX and the planarization layer PLN are shown in FIGS. 18a to 20b.

For example, materials of the passivation layer PVX and the planarization layer PLN may be insulating materials, such as silicon oxide, silicon nitride, silicon oxynitride, and the like.

For example, a material of the first electrode layer AND may be a conductive oxide material such as indium tin oxide (ITO) and indium zinc oxide (IZO), or a metal material such as gold (Au), silver (Ag), nickel (Ni), and platinum (Pt).

The foregoing descriptions are merely specific implementation manners of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising a plurality of pixel circuits, wherein the pixel circuits each include a sensing circuit and a light-emitting control circuit, and the sensing circuit has a sensing signal terminal;
   the plurality of pixel circuits are arranged in a plurality of rows in a first direction and in a plurality of columns in a second direction;
   in the second direction, any adjacent three rows of pixel circuits are a first row of pixel circuits, a second row of pixel circuits and a third row of pixel circuits; a region between the first row of pixel circuits and the second row of pixel circuits is a first gap region, and a region between the second row of pixel circuits and the third row of pixel circuits is a second gap region; and
   in the first row of pixel circuits and the second row of pixel circuits, a sensing circuit of each pixel circuit is closer to the first gap region than a light-emitting control circuit of the pixel circuit, and sensing signal terminals of sensing circuits of two pixel circuits in a same column are a same signal terminal.

2. The display substrate according to claim 1, wherein the sensing circuit includes a first transistor;
   in the first row of pixel circuits and the second row of pixel circuits, first electrodes of first transistors of the two sensing circuits in the same column are a same electrode, and constitute the sensing signal terminal.

3. The display substrate according to claim 1, further comprising a plurality of sensing signal lines, wherein
   a sensing signal line includes a first sensing signal sub-line extending in the second direction, and a plurality of second sensing signal sub-lines each extending in the first direction and electrically connected to the first sensing signal sub-line; and
   a second sensing signal sub-line is located in the first gap region and is electrically connected to sensing signal terminals of at least two columns of pixel circuits.

4. The display substrate according to claim 3, wherein the at least two columns of pixel circuits are located on opposite sides of the first sensing signal sub-line; and/or
   sensing circuits of the at least two columns of pixel circuits electrically connected to the second sensing signal sub-line are symmetrically disposed with respect to the first sensing signal sub-line.

5. The display substrate according to claim 3, wherein the two sensing circuits in the same column in the first row of pixel circuits and the second row of pixel circuits are symmetrically disposed with respect to the second sensing signal sub-line.

6. The display substrate according to claim 1, wherein the light-emitting control circuit has a first voltage signal terminal;
   in the second row of pixel circuits and the third row of pixel circuits, a light-emitting control circuit of each pixel circuit is closer to the second gap region than a sensing circuit of the pixel circuit, and first voltage signal terminals of light-emitting control circuits of two pixel circuits in a same column are a same signal terminal.

7. The display substrate according to claim 6, wherein the light-emitting control circuit includes a second transistor;
   in the second row of pixel circuits and the third row of pixel circuits, first electrodes of second transistors of the two light-emitting control circuits in the same column are a same electrode, and constitute the first voltage signal terminal.

8. The display substrate according to claim 6, further comprising a plurality of first voltage signal lines, wherein
a first voltage signal line includes a first voltage signal sub-line extending in the second direction, and a plurality of second voltage signal sub-lines each extending in the first direction and electrically connected to the first voltage signal sub-line; and
a second voltage signal sub-line is located in the second gap region and is electrically connected to first voltage signal terminals of at least two columns of pixel circuits.

9. The display substrate according to claim 8, wherein the at least two columns of pixel circuits are located on opposite sides of the first voltage signal sub-line; and/or
light-emitting control circuits of the at least two columns of pixel circuits electrically connected to the second voltage signal sub-line are symmetrically disposed with respect to the first voltage signal sub-line.

10. The display substrate according to claim 8, wherein the two light-emitting control circuits in the same column in the second row of pixel circuits and the third row of pixel circuits are symmetrically disposed with respect to the second voltage signal sub-line.

11. The display substrate according to claim 1, further comprising a plurality of first sensing signal sub-lines and a plurality of first voltage signal sub-lines, wherein the plurality of first sensing signal sub-lines and the plurality of first voltage signal sub-lines extend in the second direction; and
the first sensing signal sub-lines and the first voltage signal sub-lines are disposed alternately, and a first sensing signal sub-line and a first voltage signal sub-line that are adjacent are provided with at least one column of pixel circuits therebetween.

12. The display substrate according to claim 1, further comprising a first scan signal line, a second scan signal line, a sensing signal line, a first voltage signal line, a data signal line, and an enable signal line, wherein
each of the plurality of pixel circuits further includes a switch circuit and a driving circuit;
the switch circuit is electrically connected to the first scan signal line, the data signal line and a first node; and the switch circuit is configured to, under control of a first scan signal provided by the first scan signal line, transmit a data signal provided by the data signal line to the first node;
the light-emitting control circuit is electrically connected to the enable signal line, the first voltage signal line and a second node; and the light-emitting control circuit is configured to, under control of an enable signal provided by the enable signal line, transmit a first voltage signal transmitted by the first voltage signal line to the second node;
the driving circuit is electrically connected to the first node, the second node, and a third node; and the driving circuit is configured to, under control of an electrical signal of the first node, transmit an electrical signal of the second node to the third node; and
the sensing circuit is electrically connected to the second scan signal line, the sensing signal line, and the third node; and the sensing circuit is configured to, under control of a second scan signal provided by the second scan signal line, transmit a reference voltage signal provided by the sensing signal line to the third node, or detect an electrical signal of the third node through the sensing signal line to realize external compensation.

13. The display substrate according to claim 12, wherein the sensing circuit includes a first transistor;
a gate of the first transistor is electrically connected to the second scan signal line, a first electrode of the first transistor is electrically connected to the sensing signal line, and a second electrode of the first transistor is electrically connected to the third node;
the light-emitting control circuit includes a second transistor;
a gate of the second transistor is electrically connected to the enable signal line, a first electrode of the second transistor is electrically connected to the first voltage signal line, and a second electrode of the second transistor is electrically connected to the second node;
the switch circuit includes a third transistor;
a gate of the third transistor is electrically connected to the first scan signal line, a first electrode of the third transistor is electrically connected to the data signal line, and a second electrode of the third transistor is electrically connected to the first node;
the driving circuit includes a fourth transistor and a storage capacitor;
a gate of the fourth transistor is electrically connected to the first node, a first electrode of the fourth transistor is electrically connected to the second node, and a second electrode of the fourth transistor is electrically connected to the third node; and
a first electrode of the storage capacitor is electrically connected to the first node, and a second electrode of the storage capacitor is electrically connected to the third node.

14. The display substrate according to claim 13, wherein in the second direction, the first transistor is located on a side of the storage capacitor, and the second transistor, the third transistor, and the fourth transistor are located on another side of the storage capacitor; the fourth transistor is located between the storage capacitor and the second transistor; and
in the first direction, the third transistor is located on a side of the fourth transistor, and in the second direction, the third transistor is located between the fourth transistor and the second transistor.

15. The display substrate according to claim 13, wherein the display substrate comprises a source-drain conductive layer; the light-emitting control circuit has a first voltage signal terminal; in the second row of pixel circuits and the third row of pixel circuits, a light-emitting control circuit of each pixel circuit is closer to the second gap region than a sensing circuit of the pixel circuit, and first voltage signal terminals of light-emitting control circuits of two pixel circuits in a same column are a same signal terminal;
the first electrode of the first transistor includes a first source pattern located in the source-drain conductive layer; in the first row of pixel circuits and the second row of pixel circuits, first source patterns of two first transistors in the same column have a one-piece structure; and
the first electrode of the second transistor includes a second source pattern located in the source-drain conductive layer; in the second row of pixel circuits and the third row of pixel circuits, second source patterns of two second transistors in the same column have a one-piece structure.

16. The display substrate according to claim 15, wherein the display substrate comprises a semiconductor layer and a transfer layer that are arranged in sequence; the transfer layer is located on a side of the semiconductor layer away from the source-drain conductive layer;

the first electrode of the storage capacitor includes a first electrode plate located in the transfer layer, and the second electrode of the storage capacitor includes a second plate electrode located in the semiconductor layer and a third electrode plate located in the source-drain conductive layer, the second electrode plate is electrically connected to the third electrode plate.

17. The display substrate according to claim 12, further comprising a light-emitting device electrically connected to a pixel circuit, and a second electrode auxiliary line extending in the second direction, wherein an end of the light-emitting device is electrically connected to a third node of the pixel circuit, and another end of the light-emitting device is electrically connected to the second electrode auxiliary line.

18. A display apparatus, comprising the display substrate according to claim 1.

19. A display substrate, comprising a plurality of pixel circuits, wherein the pixel circuits each include a sensing circuit and a light-emitting control circuit, and the light-emitting control circuit has a first voltage signal terminal;

the plurality of pixel circuits are arranged in a plurality of rows in a first direction and in a plurality of columns in a second direction;

in the second direction, three adjacent rows of pixel circuits are a first row of pixel circuits, a second row of pixel circuits and a third row of pixel circuits; a region between the first row of pixel circuits and the second row of pixel circuits is a first gap region, and a region between the second row of pixel circuits and the third row of pixel circuits is a second gap region; and in the second row of pixel circuits and the third row of pixel circuits, a light-emitting control circuit of each pixel circuit is closer to the second gap region than a sensing circuit of the pixel circuit, and first voltage signal terminals of light-emitting control circuits of two pixel circuits in a same column are a same signal terminal.

20. A display apparatus, comprising the display substrate according to claim 19.

* * * * *